(12) United States Patent
Malik et al.

(10) Patent No.: US 10,036,952 B2
(45) Date of Patent: *Jul. 31, 2018

(54) PHOTOSENSITIVE POLYIMIDE COMPOSITIONS

(71) Applicant: Fujifilm Electronic Materials U.S.A., Inc., North Kingstown, RI (US)

(72) Inventors: Sanjay Malik, Attleboro, MA (US); Raj Sakamuri, Sharon, MA (US); Ognian N. Dimov, Warwick, RI (US); Binod B. De, Attleboro, MA (US); William A. Reinerth, Riverside, RI (US); Ahmad A. Naiini, East Greenwich, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/132,486

(22) Filed: Apr. 19, 2016

(65) Prior Publication Data
US 2016/0313642 A1    Oct. 27, 2016

Related U.S. Application Data

(60) Provisional application No. 62/150,381, filed on Apr. 21, 2015, provisional application No. 62/185,424, filed on Jun. 26, 2015, provisional application No. 62/263,372, filed on Dec. 4, 2015.

(51) Int. Cl.
| | | |
|---|---|---|
| G03F 7/037 | (2006.01) | |
| G03F 7/038 | (2006.01) | |
| G03C 1/805 | (2006.01) | |
| G03F 7/32 | (2006.01) | |
| G03F 7/34 | (2006.01) | |
| B29C 67/00 | (2017.01) | |
| G03F 7/16 | (2006.01) | |
| H01L 21/027 | (2006.01) | |
| H01L 21/02 | (2006.01) | |
| H01L 21/311 | (2006.01) | |
| C09D 179/08 | (2006.01) | |
| C08G 73/10 | (2006.01) | |
| G03F 7/11 | (2006.01) | |

(52) U.S. Cl.
CPC ............ G03F 7/0387 (2013.01); B29C 67/00 (2013.01); C08G 73/1014 (2013.01); C08G 73/1039 (2013.01); C08G 73/1042 (2013.01); C08G 73/1046 (2013.01); C08G 73/1067 (2013.01); C09D 179/08 (2013.01); G03C 1/805 (2013.01); G03F 7/037 (2013.01); G03F 7/11 (2013.01); G03F 7/16 (2013.01); G03F 7/325 (2013.01); G03F 7/343 (2013.01); H01L 21/0273 (2013.01); H01L 21/02118 (2013.01); H01L 21/311 (2013.01)

(58) Field of Classification Search
CPC ........ G03F 7/0382; G03F 7/033; G03F 7/325; G03F 7/037; G03F 7/0387; G03F 7/11; G03F 7/343; G03C 1/805; B29C 67/00
USPC ...... 430/270.1, 326, 906, 273.1, 281.1, 325, 430/17, 18, 311, 258, 260, 262; 264/401
See application file for complete search history.

(56) References Cited

U.S. PATENT DOCUMENTS

| | | | |
|---|---|---|---|
| 4,033,768 A | 7/1977 | Wieloch | |
| 4,681,654 A | 7/1987 | Clementi et al. | |
| 4,786,569 A | 11/1988 | Rohde et al. | |
| 4,988,413 A | 1/1991 | Chakravorty et al. | |
| 5,206,117 A | 4/1993 | Labadie et al. | |
| 5,633,117 A | 5/1997 | Barjesteh et al. | |
| 5,925,498 A | 7/1999 | Dominh et al. | |
| 6,878,500 B2 | 4/2005 | Rutter, Jr. et al. | |
| 7,141,614 B2* | 11/2006 | Okada | B32B 15/08 428/473.5 |
| 7,476,476 B2* | 1/2009 | Suwa | C08G 73/101 430/14 |
| 7,645,561 B1 | 1/2010 | Kimura et al. | |
| 2003/0087179 A1 | 5/2003 | Iwasaki | |
| 2003/0138733 A1 | 7/2003 | Sachdev et al. | |
| 2004/0161619 A1 | 8/2004 | Rushkin et al. | |
| 2004/0235992 A1 | 11/2004 | Okada et al. | |
| 2004/0265731 A1 | 12/2004 | Okada et al. | |
| 2006/0210819 A1 | 9/2006 | Dueber | |
| 2006/0240358 A1 | 10/2006 | Powell et al. | |
| 2006/0286484 A1 | 12/2006 | Powell et al. | |
| 2007/0083016 A1 | 4/2007 | Dueber et al. | |

(Continued)

FOREIGN PATENT DOCUMENTS

| | | | | |
|---|---|---|---|---|
| JP | 1-109792 | 4/1989 | ............... | H05K 3/18 |
| WO | WO 2014/107108 | 7/2014 | ............ | H01L 23/498 |

OTHER PUBLICATIONS

International Search Report and Written Opinion issued in International Application No. PCT/US16/28262 dated Jul. 18, 2016 (17 pages).
International Search Report and Written Opinion issued in International Application No. PCT/US16/28258, dated Jul. 21, 2016 (26 pages).
U.S. Appl. No. 15/132,472, filed Apr. 19, 2016, De et al.
International Preliminary Report on Patentability and Written Opinion for International Application No. PCT/US2016/028258 dated Nov. 2, 2017 (18 pages).
International Preliminary Report on Patentability and Written Opinion for International Application No. PCT/US2016/028262 dated Nov. 2, 2017 (11 pages).

*Primary Examiner* — John S Chu
(74) *Attorney, Agent, or Firm* — Fish & Richardson P.C.

(57) ABSTRACT

This disclosure relates to a photosensitive composition that includes at least one fully imidized polyimide polymer having a weight average molecular weight in the range of about 20,000 Daltons to about 70,000 Daltons; at least one solubility switching compound; at least one photoinitiator; and at least one solvent. The composition is capable of forming a film or a dry film having a dissolution rate of greater than about 0.15 micron/second using cyclopentanone as a developer.

45 Claims, No Drawings

(56) References Cited

U.S. PATENT DOCUMENTS

| | | |
|---|---|---|
| 2008/0081294 A1 | 4/2008 | Yamanaka et al. |
| 2009/0035693 A1 | 2/2009 | Sato et al. |
| 2011/0278049 A1 | 11/2011 | Kim et al. |
| 2013/0105998 A1 | 5/2013 | Matsumura et al. |
| 2014/0192305 A1 | 7/2014 | Lincker et al. |
| 2014/0343199 A1 | 11/2014 | Malik et al. |
| 2015/0219990 A1* | 8/2015 | Malik ................ C08G 73/1067 428/473.5 |
| 2016/0313642 A1 | 10/2016 | Malik et al. |

\* cited by examiner

PHOTOSENSITIVE POLYIMIDE COMPOSITIONS

CROSS-REFERENCE TO RELATED APPLICATIONS

The present application claims priority to U.S. Provisional Application Ser. No. 62/263,372, filed on Dec. 4, 2015, U.S. Provisional Application Ser. No. 62/185,424, filed on Jun. 26, 2015, U.S. Provisional Application Ser. No. 62/150,381, filed on Apr. 21, 2015. The prior applications are hereby incorporated by reference in their entirety.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures include flip chip wafer bumping using copper pillars as well as approaches employing through silicon vias (TSV) such as three-dimensional integrated circuits (3D IC) in which wafers are thinned, the resulting dies are stacked and then connected by TSV and 2.5D interposer designs. These approaches pose significant challenges not only for the designers of these new IC architectures, but for the designers of the packaging materials that will be used for these devices.

Material requirements for packaging applications are continuously evolving as these new, advanced devices are relying heavily on wafer level packaging (WLP) and 3D integration. While there are a number of traditional packaging materials that have been employed through the years, polyimides, due to their excellent electrical, mechanical and thermal properties, have been the material of choice for semiconductor packaging applications. However, drawbacks of conventional polyimides include high cure temperatures (>350° C.), high post-cure shrinkage and high levels of moisture absorption. This high shrinkage leads to cured polyimide films having high residual stress which leads to bowing of the silicon wafer. The next generation chip architectures employing 3D integration require that the silicon wafers be thinned down up to 20 μm in most advanced applications in order to satisfy requirements for vertical integration. These thinned wafers are extremely fragile and excessive residual stress in the packaging material used could be catastrophic. The next generation packaging materials should be designed so as to impart minimal stress on the wafer. For this reason, low cure temperature and low post-cure shrinkage are among the important requirements for advanced packaging materials.

Soluble polyimide polymers are known and the photosensitive compositions from those polymers have been reported. In general, when the molecular weight of the polyimide polymers are low, acceptable lithographic performance is observed. However, the mechanical properties are degraded to such an extent that compositions employing those polymers cannot be used as advanced packaging materials in the packaging process. When the polyimide molecular weight is increased, acceptable mechanical properties are achieved. However, the solubility of the resulting polyimide compositions in a developer decreases and poor lithographic performance is obtained. This disclosure describes polyimide compositions yielding both good mechanical properties and good lithographic performance suitable for advanced packaging applications.

SUMMARY OF THE DISCLOSURE

Embodiments of this disclosure feature photosensitive compositions and photosensitive films (e.g. dry films) made from those compositions having excellent lithographic and mechanical properties.

In some embodiments, this disclosure features compositions that include the following components: (A) at least one fully imidized polyimide polymer having a weight average molecular weight in the range of about 20,000 Daltons to about 70,000 Daltons; (B) at least one solubility switching compound (SSC); (C) at least one photoinitiator or a photosensitizer/initiator combination; and (D) at least one solvent, in which the composition is capable of forming a film (e.g., a dried, unexposed film) having a dissolution rate of greater than about 0.15 micron/second using cyclopentanone as a developer.

In some embodiments, this disclosure features a photosensitive composition that includes at least one polyimide polymer having a weight average molecular weight in the range of about 20,000 Daltons to about 70,000 Daltons; at least one solubility switching compound; at least one photoinitiator or a combination of a photosensitizer and an initiator; and at least one solvent. The composition is capable of forming a film (e.g., a dried, unexposed film) having a dissolution rate of greater than about 0.15 micron/second using cyclopentanone as a developer. The solubility switching compound can enhance or reduce a dissolution rate of the film in cyclopentanone compared to a film made from a photosensitive composition containing the same components without the solubility switching compound.

In some embodiments, this disclosure features a photosensitive composition that includes at least one polyimide polymer having a weight average molecular weight in the range of about 20,000 Daltons to about 70,000 Daltons; at least one solubility switching compound; at least one photoinitiator; and at least one solvent. The composition is capable of forming a film having a dissolution rate of greater than about 0.15 micron/second using cyclopentanone as a developer. The solubility switching compound increases a dissolution rate of the film in cyclopentanone compared to a film made from a photosensitive composition containing the same components without the solubility switching compound.

In some embodiments, the at least one fully imidized polyimide polymer is prepared by using at least one diamine, where the at least one diamine includes a compound selected from the group consisting of a diamine of Structure (Ia) and a diamine of Structure (Ib),

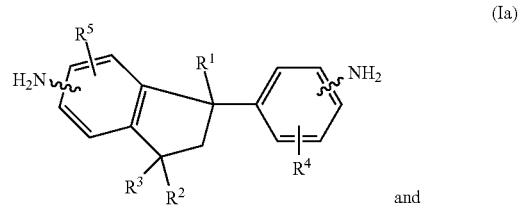

and

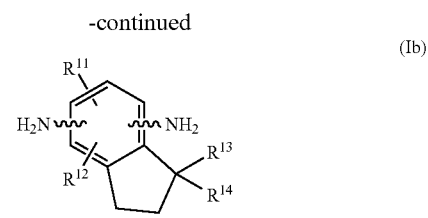

(Ib)

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or $C_5$-$C_7$ cycloalkyl group.

In some embodiments, the at least one fully imidized polyimide polymer is prepared by using at least one tetracarboxylic acid dianhydride monomer selected from the group consisting of 2,2-[bis(3,4-dicarboxyphenyl)] hexafluoropropane dianhydride, 3,3',4,4'-benzophenone tetracarboxylic dianhydride, 3,3',4,4'-diphenylsulfone tetracarboxylic dianhydride, and 3,3',4,4'-diphenyl ether tetracarboxylic dianhydride. In some embodiments, the at least one tetracarboxylic acid dianhydride monomer is a fluorinated dianhydride.

In some embodiments, the at least one diamine is selected from the group consisting of a diamine of Structure (Ia) and a diamine of Structure (Ib), and the at least one tetracarboxylic dianhydride is 2,2-[bis(3,4-dicarboxyphenyl)]hexafluoropropane dianhydride.

In some embodiments, the polyimides of this disclosure can be end-capped by reaction of the terminal group (e.g., the terminal $NH_2$ of amino-terminated polyimide polymer or the terminal anhydride of anhydride-terminated polyimide polymer) with a compound having a functional group which is reactive with the terminal group. Alternatively, the end-capping reaction of the terminal groups of amino-terminated polyamic acid or anhydride-terminated polyamic acid can be done first, followed by the chemical or thermal imidization.

In some embodiments, the end-capped group contains at least one second functional group selected from a substituted or unsubstituted alkenyl group and a substituted or unsubstituted alkynyl group.

In some embodiments, component (B) (i.e., the solubility switching compound) can include at least one functional group selected from the group consisting of a vinyl group, an allyl group, a vinyl ether group, a propenyl ether group, a (meth)acryloyl group, a SiH group, or a thiol group.

In some embodiments, the composition includes other additives including, but are not limited to, adhesion promoters, plasticizers, surfactants, dyes, and particles.

In some embodiments, the developer and the at least one fully imidized polyimide polymer has a relative energy difference of from about 0.1 to about 3.

In some embodiments, when an area of the film made from the composition is exposed to actinic radiation, the exposed area has a dissolution rate of less than about 0.02 microns/second in cyclopentanone.

In some embodiments, the solubility switching compound increases a dissolution rate of the film in cyclopentanone compared to a film made from a photosensitive composition containing the same components except the solubility switching compound.

In some embodiments, this disclosure features a photosensitive film formed from a photosensitive composition described herein.

In some embodiments, this disclosure features a process that includes coating a substrate with a composition described herein (e.g., a polyimide composition) to form a coated substrate having a film on the substrate, and baking the coated substrate to form a coated substrate having a dried film. In such embodiments, the coated substrate can be baked at a temperature from about 50° C. to about 200° C. The process can further include one or more of the following steps: (1) exposing the dried film to radiation through a mask to form a coated substrate having a dried, patternwise exposed film, (2) baking the dried, patternwise exposed film at a temperature from about 50° C. to about 150° C. in a second baking step, (3) developing a portion of the dried, exposed film in a developer to produce a relief image on the substrate, (4) rinsing the relief image on the substrate with a solvent or a mixture of solvents, and (5) baking the substrate having a relief image at a temperature from about 50° C. to about 200° C. in a third baking step.

In some embodiments, this disclosure features a process that includes: (a) providing a dry film structure comprising a carrier substrate; a protective layer; and a photosensitive polymeric layer between the carrier substrate and the protective layer; at least one solubility switching compound; and at least one photoinitiator; (b) removing the protective layer from the dry film structure; (c) applying the structure obtained in step (b) onto an electronic substrate to form a laminate; and (d) converting the photosensitive polymeric layer into a patterned layer. The photosensitive polymeric layer containing at least one fully imidized polyimide polymer having a weight average molecular weight in the range of about 20,000 Daltons to about 70,000 Daltons. The laminate containing the photosensitive polymeric layer between the electronic substrate and the carrier substrate. The patterned layer has a thickness of at most about 5 microns (e.g., at most about 4 microns or at most about 3 microns) and comprises at least one element having a feature size of at most about 3 microns (e.g., at most about 2 microns).

Some embodiments of this disclosure relate to a dry film structure that includes a carrier substrate, and a first polymeric layer (e.g., a photosensitive polymeric layer) supported by the carrier substrate. The first polymeric layer can be prepared from a photosensitive composition described herein (such as a photosensitive composition containing components (A), (B), and (C) described above). In some embodiments, the dry film can further include a protective layer such that the first polymeric layer is between the carrier substrate and the protective layer. In some embodiments, the first polymeric layer in the dry film structure can have a film thickness of at most 5 microns. In some embodiments, the dry film structure can further include a second polymeric layer, in which the second polymeric layer is between the first polymeric layer and the carrier substrate or the second polymeric layer is between the first polymeric layer and the protective layer. In some embodiments, the second polymeric layer can include a water soluble polymer.

In some embodiments, this disclosure features methods of preparation of a dry film structure. The method includes: (a) coating a carrier substrate with a composition containing at least one polyimide polymer as described earlier, at least one solubility switching compound (SSC), at least one initiator and at least one solvent, (b) drying the coated composition to form a first polymeric layer, and (c) optionally applying a protective layer to the first polymeric layer to form a dry film structure.

In some embodiments, this disclosure features a process of forming a laminate from the dry film structure described above. The process can include (a) removing the protective layer from the dry film structure if the protective layer is present in the dry film structure; and (b) applying the structure obtained in step (a) onto an electronic substrate to form a laminate. In some embodiments, the process can further include one or more of the following steps: (1) exposing the polymeric layer in the laminate to actinic radiation, (2) removing the carrier substrate before or after exposing the polymeric layer, (3) removing unexposed portions in the polymeric layer by using a developer, and (4) curing the remaining polymeric layer.

In some embodiments, this disclosure features a three dimensional object including at least one pattern film formed by a process described herein. In some embodiments, the three dimensional objects can include pattern films in at least two stacks (e.g., at least three stacks).

In some embodiments, the disclosure features a semiconductor device that includes the three dimensional object described herein. In some embodiments, the semiconductor device is an integrated circuit, a light emitting diode, a solar cell, or a transistor.

DETAILED DESCRIPTION OF THE DISCLOSURE

This disclosure features photosensitive compositions and photosensitive films made from those compositions having excellent lithographic and mechanical properties. In some embodiments, such photosensitive compositions include (A) at least one fully imidized polyimide polymer having a weight average molecular weight in the range of about 20,000 Daltons to about 70,000 Daltons; (B) at least one solubility switching compound (SSC); (C) at least one photoinitiator or a photosensitizer/initiator combination; (D) at least one solvent, in which the composition is capable of forming a film (e.g., a dried, unexposed film) having a dissolution rate of greater than about 0.15 micron/second using cyclopentanone as a developer. As mentioned herein, the phrase "unexposed film" or "a film unexposed to actinic radiation" refers to a film unexposed to actinic radiation under lithographic conditions used to form patterns.

Imidization to form a polyimide can be confirmed by observation of characteristic absorptions in the infrared spectrum from 1770 and 1700 cm$^{-1}$ attributable to the imide ring structure. As used herein, the term "fully imidized" means the polyimide polymers of this disclosure are at least about 90% (e.g., at least about 95%, at least about 98%, at least about 99%, or about 100%) imidized.

In some embodiments, the at least one fully imidized polyimide of this composition is prepared by reaction of at least one diamine with at least one dicarboxylic acid dianhydride. Examples of diamines include, but are not limited to, 1-(4-aminophenyl)-1,3,3-trimethylindan-5-amine (alternative names including 4,4'-[1,4-phenylene-bis(1-methylethylidene)]bisaniline, 1-(4-aminophenyl)-1,3,3-trimethyl-2H-inden-5-amine, 1-(4-aminophenyl)-1,3,3-trimethylindan-5-amine, [1-(4-aminophenyl)-1,3,3-trimethyl-indan-5-yl]amine, and 1-(4-aminophenyl)-2,3-dihydro-1,3,3-trimethyl-1H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, 5,7-diamino-1,1-dimethyl-4-ethylindan, p-phenylenediamine, m-phenylenediamine, o-phenylenediamine-3-methyl-1,2-benzene-diamine, -1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,2-diaminocyclohexane, 1,4-diaminocyclohexane, 1,3-cyclohexanebis(methylamine), 5-amino-1,3,3-trimethyl cyclohexanemethanamine, 2,5-diaminobenzotrifluoride, 3,5-diaminobenzotrifluoride, 1,3-diamino-2,4,5,6-tetrafluorobenzene, 4,4'-oxydianiline, 3,4'-oxydianiline, 3,3'-oxydianiline, 3,3'-diaminodiphenylsulfone, 4,4'-diaminodiphenylsulfones, 4,4'-isopropylidenedianiline, 4,4'-diaminodiphenylmethane, 2,2-bis(4-aminophenyl)propane, 4,4' diaminodiphenyl propane, 4,4'-diaminodiphenyl sulfide, 4,4'-diaminodiphenylsulfone, 4-aminophenyl-3-aminobenzoate, 2,2'-dimethyl-4,4'-diaminobiphenyl, 3,3'-dimethyl-4,4'-diaminobiphenyl, 2,2'-bis(trifluoromethyl)benzidine, 3,3'-bis(trifluoromethyl)benzidine, 2,2-bis[4-(4-aminophenoxy phenyl)]hexafluoropropane, 2,2-bis(3-amino-4-methylphenyl)-hexafluoropropane, 2,2-bis(3-aminophenyl)-1,1,1,3,3,3-hexafluoropropane, 1,3-bis-(4-aminophenoxy)benzene, 1,3-bis-(3-aminophenoxy)benzene, 1,4-bis-(4-aminophenoxy)benzene, 1,4-bis-(3-aminophenoxy)benzene, 1-(4-aminophenoxy)-3-(3-aminophenoxy)benzene, 2,2'-bis-(4-phenoxyaniline)isopropylidene, bis(p-beta-amino-t-butylphenyl)ether, p-bis-2-(2-methyl-4-aminopentyl)benzene, p-bis(1,1-dimethyl-5-aminopentyl)benzene, 3,3'-dimethyl-4,4'-diaminobiphenyl, 4,4'-diaminobenzophenone, 3'-dichlorobenzidine, 2,2-bis[4-(4-aminophenoxy)phenyl] propane, 4,4'-[1,3-phenylenebis(1-Methyl-ethylidene)]bisaniline, 4,4'-[1,4-phenylenebis(1-methyl-ethylidene)]bisaniline, 2,2-bis[4-(4-aminophenoxy)phenyl]sulfone, 2,2-bis[4-(3-aminophenoxy)benzene], 1,4-bis(4-aminophenoxy) benzene, 1,3-bis(4-aminophenoxy)benzene, (1,3'-bis(3-aminophenoxy)benzene, and 9H-fluorene-2,6-diamine. Any of these diamines can be used individually or in combination in any ratio as long as the resulting polyimide polymer satisfies the requirements of this disclosure.

In general, the polyimide polymer thus formed can be soluble in an organic solvent. In some embodiments, the polyimide polymer can have a solubility in an organic solvent of at least about 50 mg/mL (e.g., at least about 100 mg/mL or at least about 200 mg/mL) at 25° C.

In some embodiments, the at least one diamine includes a compound selected from the group consisting of a diamine of Structure (Ia) and a diamine of Structure (Ib):

and

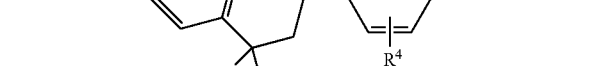

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or $C_5$-$C_7$ cycloalkyl group.

Examples of the substituted or unsubstituted $C_1$-$C_6$ linear or branched alkyl groups in $R^1$, $R^2$, $R^3$, $R^4$, $R^5$, $R^{11}$, $R^{12}$, $R^{13}$, and $R^{14}$ include, but are not limited to, methyl, ethyl, propyl, isopropyl, butyl, isobutyl, t-butyl, amyl, hexyl, and 2-methylhexyl. Examples of the $C_5$-$C_7$ cycloalkyl group in $R^1$, $R^2$, $R^3$, $R^4$, $R^5$, $R^{11}$, $R^{12}$, $R^{13}$, and $R^{14}$ include, but are not limited to, cyclopentyl, cyclohexyl, and cycloheptyl.

Examples of preferred diamines of this embodiment include, but are not limited to, 1-(4-aminophenyl)-1,3,3-trimethylindan-5-amine (alternative names including 4,4'-[1,4-phenylene-bis(1-methylethylidene)]bisaniline, 1-(4-aminophenyl)-1,3,3-trimethyl-2H-inden-5-amine, 1-(4-aminophenyl)-1,3,3-trimethyl-indan-5-amine, [1-(4-aminophenyl)-1,3,3-trimethyl-indan-5-yl]amine, and 1-(4-aminophenyl)-2,3-dihydro-1,3,3-trimethyl-1H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, and 5,7-diamino-1,1-dimethyl-4-ethylindan.

In some embodiments, the molar percentage of the preferred diamines in the total amount of diamines is at least about 30% (e.g., at least about 35%, at least about 40%, at least about 45%, or at least about 50%) to at most about 100% (e.g., at most about 95%, at most about 90%, at most about 80%, at most about 75% or at most about 70%).

In some embodiments, the polyimide polymer can be prepared from diamines excluding the diamine of Structure (II)

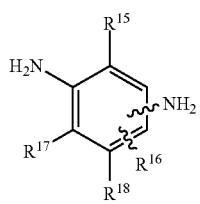

Structure (II)

in which $R^{15}$, $R^{16}$, $R^{17}$ and $R^{18}$, independently, is H, a substituted or unsubstituted $C_1$-$C_6$ linear or branched alkyl group, or $C_5$-$C_7$ cycloalkyl group. In some embodiments, at least three of $R^{15}$, $R^{16}$, $R^{17}$ and $R^{18}$ are not hydrogen.

Examples of the substituted or unsubstituted $C_1$-$C_6$ linear or branched alkyl groups in $R^{15}$, $R^{16}$, $R^{17}$ and $R^{18}$ include, but are not limited to, methyl, ethyl, propyl, isopropyl, butyl, isobutyl, t-butyl, amyl, hexyl, and 2-methylhexyl. Examples of the $C_5$-$C_7$ cycloalkyl group in $R^{15}$, $R^{16}$, $R^{17}$ and $R^{18}$ include, but are not limited to, cyclopentyl, cyclohexyl, and cycloheptyl.

Examples of diamines of Structure (II) include, but are not limited to, 2,3,5,6-tetramethylphenylenediamine, 1,4-diamino-1,3,5-trimethylbenzene, 2,4-diamino-1,3,5-triethylbenzene, 2,4-diamino-3,5-dimethyl-1-ethylbenzene, 2,4-diamino-1,5-dimethyl-3-ethylbenzene, 2,4-diamino-1,3,5-triisopropylbenzene, 2,3,5,6-tetraisopropylphenylenediamine and 2,4-diamino-1,3,5,6-tetramethylbenzene.

In some embodiments, the polyimide polymer can be prepared from diamines excluding 2,4-diamino-1,3,5-trimethylbenzene.

In some embodiments, the polyimide can be prepared from diamines excluding the siloxane diamine of Structure (III):

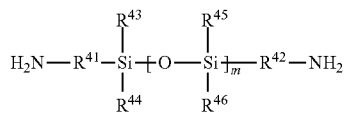

in which $R^{41}$ and $R^{42}$ are each independently a divalent aliphatic or aromatic group, $R^{43}$, $R^{44}$, $R^{45}$ and $R^{46}$ each independently is a monovalent aliphatic or aromatic group, m is an integer of 1-100.

Examples of monomer of siloxane diamines of structure (III) include, but are not limited to:

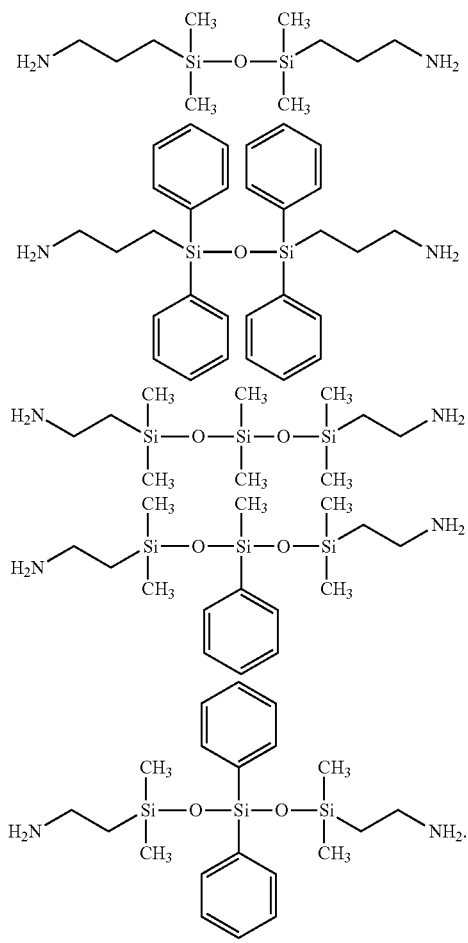

In general, to form a polyimide polymer described herein, the diamines can be reacted with at least one tetracarboxylic acid dianhydride. Examples of the tetracarboxylic acid anhydride include, but are not limited to, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, and 1-(3',4'-dicarboxyphenyl)-3-methylindan-6,7-dicarboxylic acid anhydride, pyromellitic dianhydride, benzene-1,2,3,4-tetracarboxylic acid dianhydride, 2,3,5,6-naphthalenetetracarboxylic acid dianhydride, 2,3,6,7-naphthalenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic dianhydride, 2,3,6,7-tetrachloronaphthalene-1,4,5,
8-tetracarboxylic dianhydride, phenanthrene-,8,9,10-
tetracarboxylic dianhydride, 3,4,9,10-
perylenetetracarboxylic acid dianhydride, pyrazine-2,3,5,6-
tetracarboxylic dianhydride, thiophene-2,3,4,5-
tetracarboxylic dianhydride, 2,3,5,6-pyridinetetracarboxylic
acid dianhydride, butane-1,2,3,4-tetracarboxylic acid dian-
hydride, 1,2,3,4-cyclopentanetetracarboxylic acid dianhy-
dride, cyclobutane-1,2,3,4-tetracarboxylic acid dianhydride,
cyclopentane-1,2,3,4-tetracarboxylic acid dianhydride,
cyclohexane-1,2,4,5-tetracarboxylic acid dianhydride, nor-
bornane-2,3,5,6-tetracarboxylic acid dianhydride, bicyclo
[2.2.2]oct-7-ene-3,4,8,9-tetracarboxylic acid dianhydride,
tetracyclo[4.4.1.0$^{2,5}$0.0$^{7,10}$]undecane-1,2,3,4-tetracarbox-
ylic acid dianhydride, 3,3',4,4'-benzophenone tetracarbox-
ylic dianhydride, 2,2',3,3'-benzophenone tetracarboxylic
dianhydride, 2,3,3',4'-benzophenone tetracarboxylic dianhy-
dride, 3,3',4,4'-diphenylsulfone tetracarboxylic dianhydride,
2, 2',3, 3'-diphenylsulfone tetracarboxylic dianhydride, 2, 3,
3',4'-diphenylsulfone tetracarboxylic dianhydride, 3,3',4,4'-
diphenyl ether tetracarboxylic dianhydride, 2,2',3,3'-diphe-
nyl ether tetracarboxylic dianhydride, 2,3,3',4'-diphenyl
ether tetracarboxylic dianhydride, 2,2-[bis(3,4-dicarboxy-
phenyl)]hexafluoropropane dianhydride, ethyleneglycol bis
(anhydrotrimellitate), and 5-(2,5-dioxotetrahydro)-3-
methyl-3-cyclohexene-1,2-dicarboxylic anhydride.

Examples of preferred tetracarboxylic acid dianhydride
monomers include, but are not limited to, 1-(3',4'-dicarboxy-
phenyl)-1,3,3-trimethylindan-5,6-dicarboxylic acid dianhy-
dride, 1-(3',4'-dicarboxyphenyl)-1,3,3-trimethylindan-6,7-
dicarboxylic acid dianhydride, 1-(3',4'-dicarboxyphenyl)-3-
methylindan-5,6-dicarboxylic acid dianhydride, and 1-(3',4'-
dicarboxyphenyl)-3-methylindan-6,7-dicarboxylic acid
anhydride, pyrazine-2,3,5,6-tetracarboxylic dianhydride,
thiophene-2,3,4,5-tetracarboxylic dianhydride, 2,3,5,6-pyri-
dinetetracarboxylic acid dianhydride, norbornane-2,3,5,6-
tetracarboxylic acid dianhydride, bicyclo[2.2.2]oct-7-ene-3,
4,8,9-tetracarboxylic acid dianhydride, tetracyclo[4.4.1.
0$^{2,5}$0.0$^{7,10}$]undecane-1,2,3,4-tetracarboxylic acid dianhy-
dride, 3,3',4,4'-benzophenone tetracarboxylic dianhydride,
3,3',4,4'-diphenylsulfone tetracarboxylic dianhydride, 3,3',4,
4'-diphenyl ether tetracarboxylic dianhydride, 2,3,3',4'-di-
phenyl ether tetracarboxylic dianhydride, 2,2-[bis(3,4-dicar-
boxyphenyl)]hexafluoropropane dianhydride,
ethyleneglycol bis(anhydrotrimellitate), and 5-(2,5-dioxo-
tetrahydro)-3-methyl-3-cyclohexene-1,2-dicarboxylic anhy-
dride. More preferred tetracarboxylic acid dianhydride
monomers include 2,2-[bis(3,4-dicarboxyphenyl)]hexafluo-
ropropane dianhydride 3,3',4,4'-benzophenone tetracarbox-
ylic dianhydride, 3,3',4,4'-diphenylsulfone tetracarboxylic
dianhydride, and 3,3',4,4'-diphenyl ether tetracarboxylic
dianhydride. Any suitable combination of tetracarboxylic
acid dianhydride monomers described above in any suitable
ratio can be used to form the polyimide polymer describe
herein.

In some embodiments, examples of tetracarboxylic acid
dianhydride monomers include:

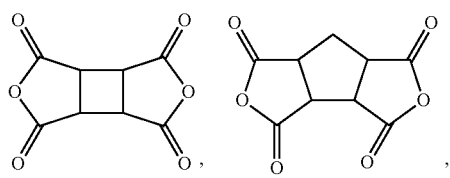

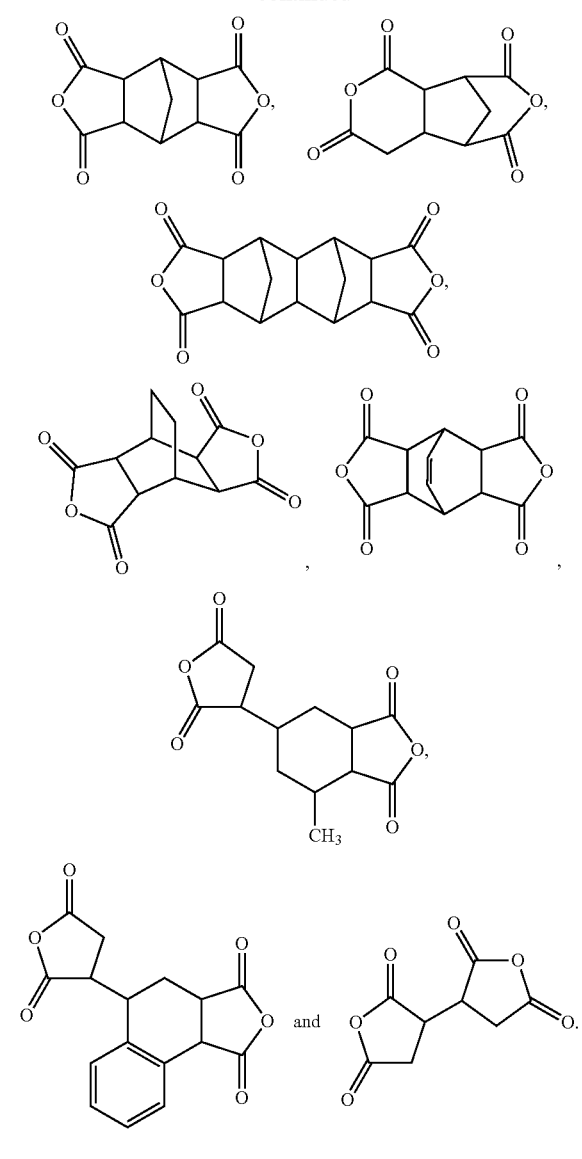

In some embodiments, the tetracarboxylic acid dianhy-
dride monomer can be a fluorinated dianhydride selected
from the group consisting of:

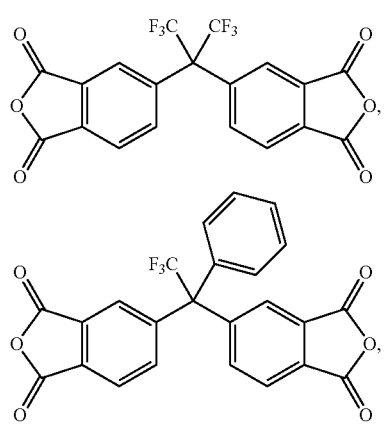

-continued

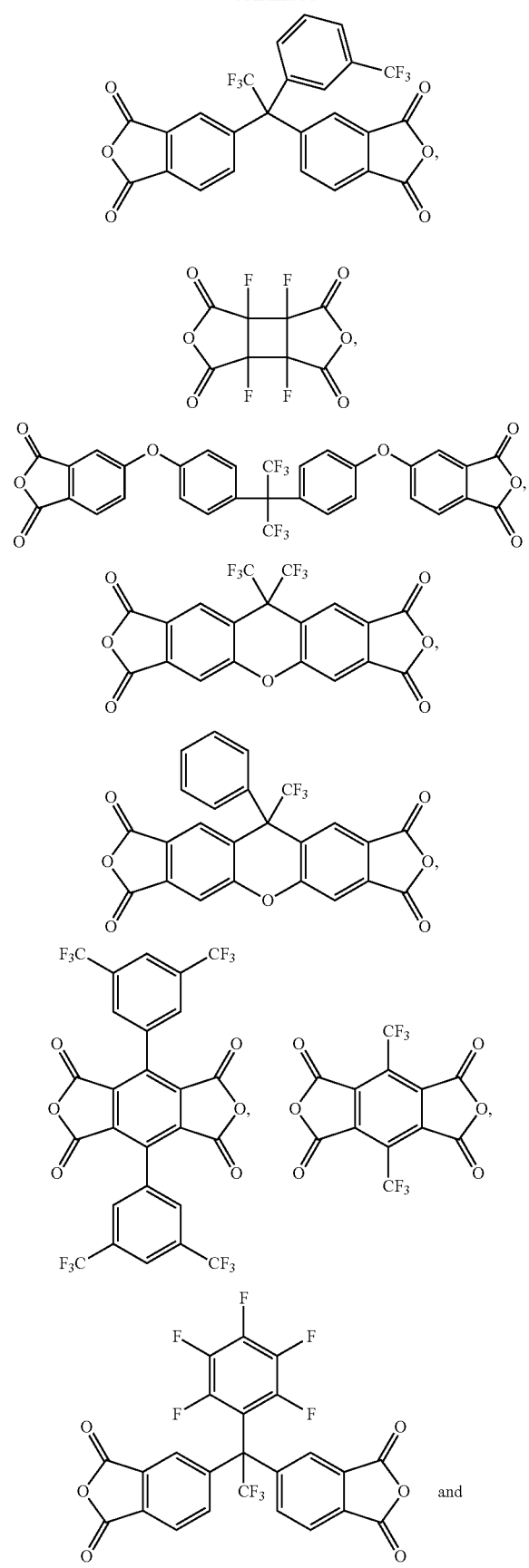

-continued

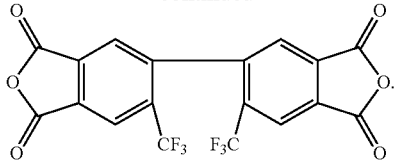

In some embodiments, the amount of fluorine in the polyimide polymer is at most about 30% of total weight of the polymer (e.g. about 28% of total weight of the polymer, about 26% of total weight of the polymer, about 25% of total weight of the polymer, about 24% of total weight of the polymer, or about 23% of total weight of the polymer).

In some embodiments, at least one diamine is selected from the group consisting of a diamine of Structure (Ia) and a diamine of Structure (Ib), and the tetra carboxylic dianhydride is selected from the group consisting of pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$0.0$^{7,10}$]undecane-1,2,3,4-tetracarboxylic acid dianhydride, 3,3',4,4'-benzophenone tetracarboxylic dianhydride, 3,3',4,4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis(3,4-dicarboxyphenyl)]hexafluoropropane dianhydride, ethyleneglycol bis(anhydrotrimellitate), and 5-(2,5-dioxotetrahydro)-3-methyl-3-cyclohexene-1,2-dicarboxylic anhydride.

In some embodiments, the at least one diamine is selected from the group consisting of a diamine of Structure (Ia) and a diamine of Structure (Ib), and the tetra carboxylic dianhydride is 2,2-[bis(3,4-dicarboxyphenyl)]hexafluoropropane dianhydride.

In some embodiments, at least one diamine is reacted with at least one tetracarboxylic acid dianhydride to yield a polyamic acid of Structure (IV) where X is the nucleus of the precursor diamine, and Y is the nucleus of the precursor dianhydride. As used herein, when referring to the precursor diamine, "nucleus" refers to the portion of the molecule between the amine functional groups. When referring to the precursor dianhydride, "nucleus" refers to the portion of the molecule between the anhydride functional groups.

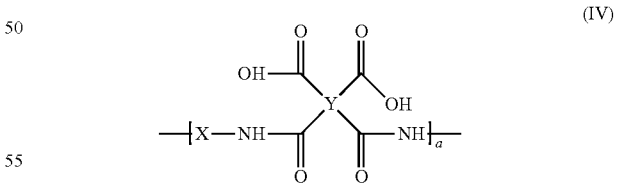

(IV)

The polyamic acid of Structure (IV) can be synthesized by numerous synthetic procedures or variations of those procedures known to those skilled in the art. In general, a polyamic acid of Structure (IV) can be formed through a condensation polymerization reaction between one or more diamines and one or more tetracarboxylic acid dianhydrides. For example, one can bring one or more diamines in contact with one or more tetracarboxylic acid dianhydrides in the presence of a solvent suitable to dissolve the monomers and, preferably, the resultant polyamic acid.

In some embodiments, to prepare a polyamic acid, the diamine component and tetracarboxylic acid dianhydride component are charged into a reaction vessel at the same time or by charging one of the components in the form of a solid or solution into a solution of the other component (complete dissolution of all materials might not occur). Charging both the components at the same time is advantageous in view of the productivity because the time required for charging is shortened. Generally, the condensation polymerization reaction between the diamine component and tetracarboxylic acid dianhydride component can be carried out at about 15° C. to about 80° C. for about 1 to about 48 hours.

Suitable polymerization solvents useful in the present disclosure include, but are not limited to, N-methyl-2-pyrrolidone, N,N-dimethylformamide, dimethylsulfoxide, gamma-butyrolactone, N,N-dimethylacetamide, tetramethylene sulfone, p-chlorophenol, m-cresol, diethyleneglycol methyl ether, methyl-3-methoxyproprionate, ethyl-3-ethoxypropionate, cyclohexanone, propylene glycol monomethyl ether acetate, and 2-chloro-4-hydroxytoluene. These solvents can be used singly or in combination of two or more. Of these solvents, preferred are N-methyl-2-pyrrolidone, gamma-butyrolactone and N,N-dimethylacetamide, with N-methyl-2-pyrrolidone being more preferred. In some embodiments, a poor solvent for the polyimide can be used in combination with these solvents in such an amount to not allow the polyamic acid to precipitate. Examples of such a poor solvent include hexane, heptane, benzene, toluene, xylene, chlorobenzene and o-dichlorobenzene. The amount of the poor solvent to be used is preferably 50 percent by weight or less (inclusive of zero) based on the total amount of the solvents. The polyamic acid thus produced can be isolated by precipitation into a non-solvent or a poor solvent and collected by filtration, followed by further synthetic processes for conversion to a polyimide. In some embodiments, such isolation of the polyamic acid is not required.

In some embodiments, the molar ratio of diamine component(s) to tetracarboxylic acid dianhydride component(s) can be greater than 1.00. The resulting species is an amino-terminated polyamic acid (e.g., a polyamic acid of Structure (Va)). The molar ratio of diamine component(s) to tetracarboxylic acid dianhydride component(s) has direct effect on final molecular weight of polyamic acid and polyimide prepared by imidization of said polyamic acid. in some embodiments, the molar ratio is selected such that the polyamic acid at the end of reaction has a weight average molecular weight (Mw) of at least about 20,000 Daltons (e.g. at least about 25,000 Daltons, at least about 30,000 Daltons, at least about 35,000 Daltons, at least about 40,000 Daltons, or at least about 45,000 Daltons) and/or at most about 70,000 Daltons (e.g. at most about 65,000 Daltons, at most about 60,000 Daltons, at most about 55,000 Daltons, or at most about 50,000 Daltons).

Structure (Va)

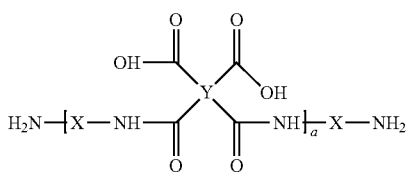

When a molar excess of tetracarboxylic acid dianhydride is employed, an anhydride-terminated polyamic acid (e.g., a polyamic acid of Structure (Vb)) is produced.

Structure (Vb)

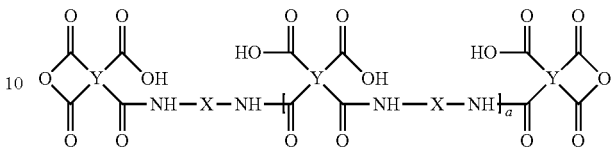

The molar ratio of tetracarboxylic acid dianhydrides to diamines should be selected such that the polyamic acid at the end of the reaction has a weight average molecular weight (Mw) of at least about 20,000 Daltons (e.g. at least about 25,000 Daltons, at least about 30,000 Daltons, at least about 35,000 Daltons, at least about 40,000 Daltons, or at least about 45,000 Daltons) and/or at most about 70,000 Daltons (e.g. at most about 65,000 Daltons, at most about 60,000 Daltons, at most about 55,000 Daltons, or at most about 50,000 Daltons).

Those skilled in the art will understand that there are multiple synthetic pathways to convert polyamic acids (e.g., those of Structures (Va) and (Vb)) to the polyimide polymers of this disclosure. For example, one pathway is to imidize polyamic acids of Structures (Va) and (Vb) using chemical or thermal imidization techniques to form polyimides of Structure (VIa) or (VIb).

Structure (VIa)

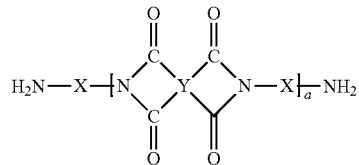

Structure (VIb)

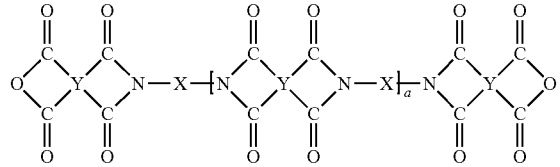

In some embodiments, the polyimide of this invention can be end-capped by reaction of the terminal group (e.g., the terminal NH$_2$ in Structure (VIa) and the terminal anhydride in Structure (VIb)) with a compound having a functional group which is reactive with the terminal group and then imidized. Alternatively, the end-capping reaction of the terminal group in Structure (VIa) or (VIb) can be done after the chemical or thermal imidization.

Another synthetic pathway is to include in the polymerization reaction a monoamine or monoanhydride. In such embodiments, the end-capping reaction is performed together with the polymerization reaction.

The thermal imidization can, for example, be performed in the solid state at a temperature ranging from about 100° C. to about 400° C. (e.g., from about 200° C. to about 300° C., or about 250° C.). In another embodiment, the thermal imidization can be performed in a solution at a temperature ranging from about 100° C. to about 250° C. When the heat treatment is performed within this temperature range, the imidization reactivity can be controlled within a desired range, minimizing non-reacted polyamic acid. In some embodiments, the thermal imidization in this manner is best done before reaction of the polymer terminal groups.

The polyamic acid can also be dehydrated using an azeotroping thermal procedure. An example of this reaction is described in U.S. Pat. No. 5,478,915. For example, after the synthesis of the polyamic acid is complete, toluene is added, and the solution is azeotropically refluxed at 155° C., collecting the water in a Dean-Stark trap.

In some embodiments, the polyimide of Structure (VIa) or (VIb) is produced by chemical imidization. For example, a chemical imidizing agent (e.g., a dehydrating agent) can be added to the polyamic acid of Structure (Va) or (Vb). This chemical imidization agent can catalyze the ring-closing dehydration process of the polyamic acid groups to form imide functionalities on the polymer backbone. If the polyamic acid is isolated after the synthesis, it can be re-dissolved in a compatible solvent. Normally, when a chemical imidization is employed, the imidization reaction takes place without isolation of the polyamic acid.

A suitable dehydrating agent can be used alone or in combination with a non-nucleophilic base to imidize the polyamic acid. Examples of suitable dehydrating agents include, but are not limited to, trifluoromethane sulfonic acid, methanesulfonic acid, p-toluenesulfonic acid, ethanesulfonic acid, butanesulfonic acid, perfluorobutanesulfonic acid, acetic anhydride, propionic anhydride, and butyric anhydride. If used, the non-nucleophilic base employed can be the same as or different from a non-nucleophilic base employed in the end-capping reaction. Examples of suitable non-nucleophilic bases include, but are not limited to, pyridine, triethylamine, tripropylamine, tributylamine, dicyclohexylmethylamine, 2-methylpyridine, 2,6-lutidine, 3,5-lutidine, 4-picoline, 4-dimethylaminopyridine (DMAP) and the like.

In some embodiments, the chemical imidization process is carried out with a suitable dehydrating reagent and a non-nucleophilic base at about 60° C. to about 130° C. for about 6 hours to about 48 hours. The dehydrating agent and non-nucleophilic base can be employed in equimolar concentrations. In another embodiment, the molar ratio of dehydrating agent to non-nucleophilic base is from about 1.1 to about 10 (e.g., from about 1.25 to 5, or from about 1.5 to about 3.0). In one embodiment, about 90 mole % to 200 mole % of a dehydrating agent based on the total amount of the polyamic acid present in the mixture is used to complete the imidization reaction. In some embodiments, 100 mole % to 160 mole % of a dehydrating agent is used to complete the imidization process.

Imidization to form a polyimide of Structure (VIa) or (VIb) can be confirmed by observation of characteristic absorptions in the infrared spectrum from 1770 and 1700 cm$^{-1}$ attributable to the imide ring structure.

In some embodiments the end-capped group contains at least one second functional group selected from a substituted or unsubstituted alkenyl group and a substituted or unsubstituted alkynyl group.

The terminal $NH_2$ groups of the polymers of Structures (Va) and (VIa) can be optionally end-capped by reaction with an end-capping compound having a functional group which is reactive to an amine. Examples of such end-capping compounds include, but are not limited to, acid chloride compounds, dicarboxylic acid anhydrides, epoxide compounds, and isocyanate compounds. In some embodiments, end-capping compounds can be those containing at least one second functional group selected from a substituted or unsubstituted alkenyl group and a substituted or unsubstituted alkynyl group. Examples of substituted alkenyl groups include, but are not limited to, acrylates, methacrylates, stilbenes, and vinyl ethers. Examples of substituents on alkynyl groups include, but are not limited to alkyl (e.g., Me or Et), aryl (e.g., phenyl or substituted phenyl), alkanoyl (e.g., acetyl) and aroyl (e.g., benzoyl).

Examples of end-capping compounds having a first functional group reactive to the terminal $NH_2$ groups that also have at least one second functional group selected from a substituted or unsubstituted alkenyl group and a substituted or unsubstituted alkynyl group include, but are not limited to, the following compounds:

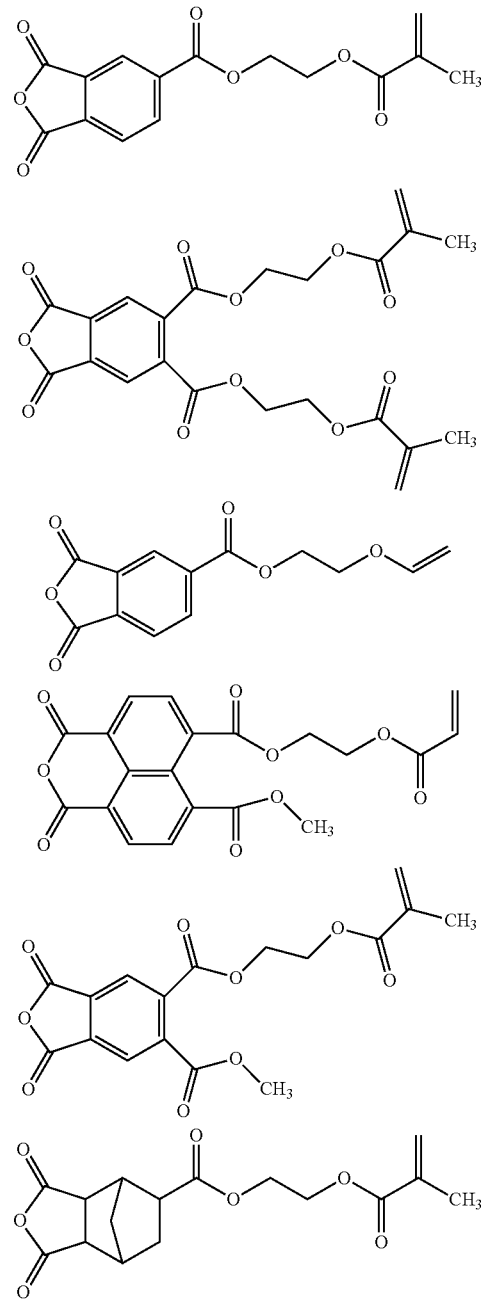

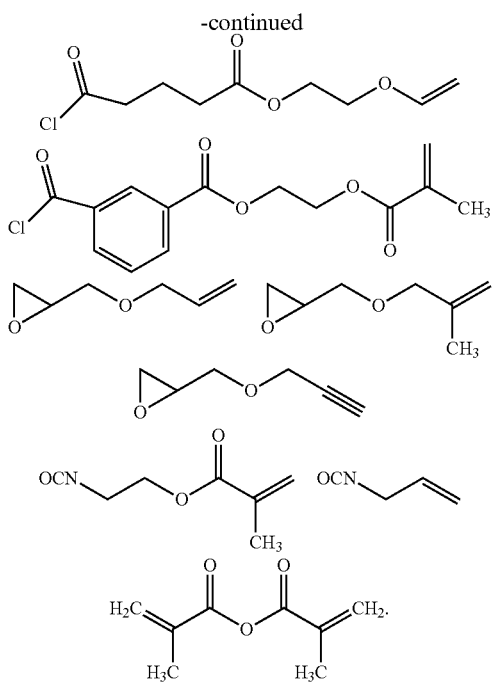

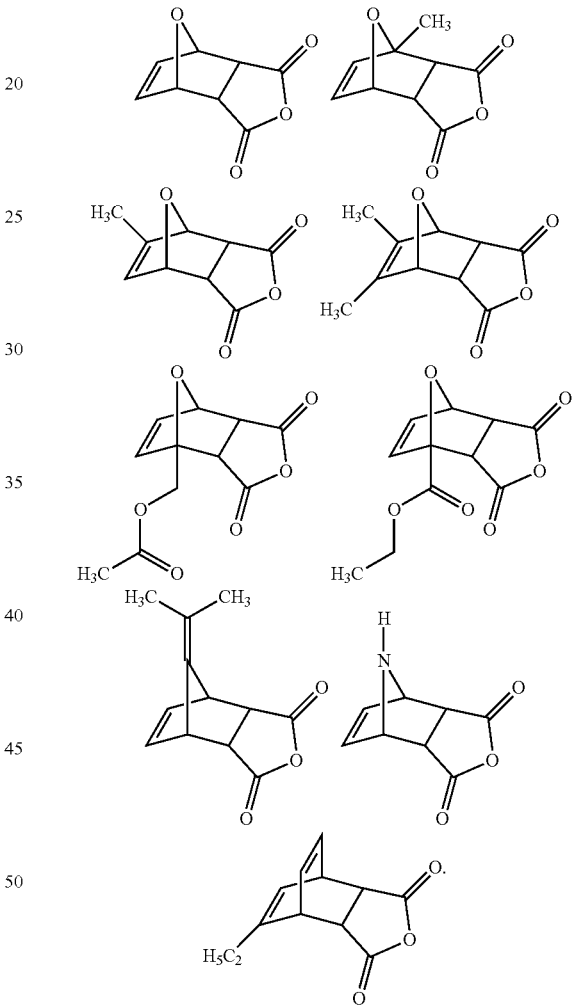

When anhydrides are employed as the reactive functional group to end-cap the polymers of Structures (Va) and (VIa), end groups containing amic acids are produced. Polyamic acids terminating polymers of Structure (Va) can be imidized when the backbone polyamic acids are imidized. When monoanhydrides are employed as the reactive functional group to end-cap an amino-terminated polyimide, the terminated group will be a polyamic acid. These terminal polyamic acids can imidize spontaneously or during isolation and drying, or can easily be imidized with mild heat or with a minimal of dehydrating agent.

In some embodiments, the monoanhydride suitable for preparing the end capped polyamic acids or polyimides contains a "masked" maleic anhydride group, which after conversion of the anhydride group to an imide group, becomes a "masked" maleimide group. This terminal imide group is able to undergo a cycloreversion reaction (e.g., a retro-Diels-Alder reaction) to unmask the maleimide group. A polyimide polymer containing maleimide groups as endcap groups can react with a solubility switching compound (SSC) (e.g., a compound containing at least two thiol groups) to form a cross-linked polyimide.

Examples of monoanhydrides that can undergo a cycloreversion reaction include, but are not limited to, compounds described by Structure IX:

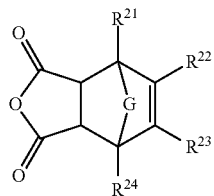

Structure IX where G is —O—, —(NR$^{25}$)—, —[C(R$^{26}$)═C(R$^{27}$)]—, or —[C═C(R$^{28}$)$_2$]—, in which each of R$^{25}$, R$^{26}$, R$^{27}$, and R$^{28}$, independently, is H, a substituted or unsubstituted C$_1$-C$_{12}$ linear, branched, monocyclic or polycyclic alkyl group, or a substituted or unsubstituted phenyl group, and each of R$^{21}$, R$^{22}$, R$^{23}$ and R$^{24}$, independently, is H, a substituted or unsubstituted C$_1$-C$_{12}$ linear, branched, monocyclic or polycyclic alkyl group, a substituted or unsubstituted phenyl group, OR$^{29}$, CH$_2$OR$^{30}$, CH$_2$OC(═O)R$^{31}$, CH$_2$C(═O)OR$^{32}$, CH$_2$NHR$^{33}$, CH$_2$NHC(═O)R$^{34}$, CH$_2$C(═O)N(R$^{35}$)$_2$, C(═O)OR$^{36}$, in which each of R$^{29}$, R$^{30}$, R$^{31}$, R$^{32}$, R$^{33}$, R$^{34}$, R$^{35}$ and R$^{36}$, independently, is H or a substituted or unsubstituted C$_1$-C$_6$ linear, branched, or monocyclic alkyl group.

Examples of specific suitable monoanhydrides of Structure IX include, but are not limited to, the following compounds:

The terminal anhydride groups of the anhydride terminated polymers of Structures (Vb) and (VIb) can be optionally end-capped by reaction with a compound having a first functional group which is reactive with an anhydride. In some embodiments, end-capping compounds are those having at least one second functional group selected from a substituted or unsubstituted alkenyl group and a substituted or unsubstituted alkynyl group. Examples of such compounds include, but are not limited to, amine compounds, alcohols, and thiols. In some embodiments, end-capping compounds can be those containing at least one second functional group selected from a substituted or unsubstituted alkenyl group and a substituted or unsubstituted alkynyl group.

Examples of end-capping compounds containing reactive groups include, but are not limited to, the following compounds:

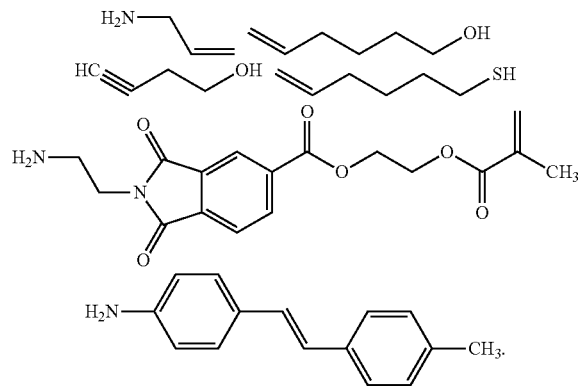

In some cases, a non-nucleophilic base can be used to facilitate the reaction with the terminal anhydride groups. Examples of suitable non-nucleophilic bases include, but are not limited to, pyridine, triethylamine, tripropylamine, tributylamine, dicyclohexylmethylamine, 2-methylpyridine, 2,6-lutidine, 3,5-lutidine, 4-picoline, 4-dimethylaminopyridine (DMAP) and the like.

When the anhydride terminated polymers of Structures (Vb) and (VIb) are end-capped with an amine containing compound, end groups containing amic acids are produced. In this situation, when the polyamic acids are imidized, the endcap is imidized as well. The polyamic acid resulting from the end-capping of anhydride terminated polyimides with an amine containing compound can be isolated. Alternatively, the terminal polyamic acid can be imidized thermally or chemically during or after the formation of the polyimide.

In some embodiments, the resulting polyimides of the present disclosure can be isolated by precipitation into water and/or an organic solvent, recovered by filtration, and dried. In another embodiment, the polyimide of the present disclosure can be isolated by addition of its solution to a combination of water and a suitable water-immiscible solvent. Because of the lower polarity nature of the monomer moieties in the polyimide polymer, higher solubility in lower polarity water immiscible solvents allows the polyimide of this disclosure, unlike most polyimides, to be extracted from the higher polarity reaction solvent/water mixture. This extracted polymer solution can be purified by washing with water followed by separation of the water layer, distillation of various volatile compounds, and subsequent extraction into a higher boiling solvent.

The solubility switching compound (SSC) (component B) generally helps generate a contrast in the dissolution rate of the film prepared from the photosensitive composition described herein before and after exposure. In some embodiments, the SSC possesses at least one (e.g., at least two or at least three) functional group capable of reacting with other SSC compounds or with the optional terminal functional group on the polyimide polymer (e.g., the second functional group of the end-capping reagent, now on the polyimide polymer described above). The SSC can be a monomer or an oligomer. The oligomer can contain two or more monomer units and is capable of further reactions to be incorporated in the final polyimide polymer. Examples of such monomer units/oligomers are based on one or more of the following types: (meth)acrylates, esters, vinyl compounds (e.g., vinyl alcohol), urethanes, ureas, imides, amides, carboxazoles, carbonates, pyranoses, siloxanes, urea-formaldehydes and melamine-formaldehydes. As used herein, the term "(meth)acrylate" include both acrylate compounds and methacrylate compounds. In some embodiments, the SSC contains at least one terminal and/or pendant reactive functional group capable of radical, or thermal reaction with the at least one second functional group. In one embodiment, the reactive functional group on the SSC includes a double or triple bond.

Suitable examples of reactive functional groups on the SSC include, but are not limited to, a vinyl group, an allyl group, a vinyl ether group, a propenyl ether group, a (meth)acryloyl group, a —SiH group and a —SH (thiol) group.

In one embodiment, a suitable example of an SSC includes, but is not limited to, an urethane acrylate oligomer. The term "urethane acrylate oligomer" refers to a class of compounds that contain urethane linkages and have (meth)acrylate (e.g., acrylate or methacrylate) functional groups such as urethane multi(meth)acrylate, multiurethane (meth)acrylate, and multiurethane multi(meth)acrylate. Types of urethane (meth)acrylate oligomers have been described by, for example, Coady et al., U.S. Pat. No. 4,608,409 and by Chisholm et al., U.S. Pat. No. 6,844,950. Other specific examples of SSC include 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

Examples of SSC compounds containing thiol groups include, but are not limited to, trimethylolpropane tris(mercaptoacetate), pentaerythritol tetrakis(mercaptoacetate), dipentaerythritol hexakis(3-mercaptopropionate), and ethoxylated trimethylolpropane tri-3-mercaptopropionate. Examples of SSC compounds containing vinyl ether groups include, but are not limited to, 1,4-butanediol divinyl ether, 1,4-cyclohexanedimethanol divinyl ether, di(ethylene glycol) vinyl ether, poly(ethylene glycol)divinyl ether, and bis[4-(vinyloxy)butyl](4-methyl-1,3-phenylene)biscarbamate. One example of a SSC compound containing a SiH group is octasilane POSS® SH1310 available from Hybrid Plastics.

In some embodiments, solubility switching compounds do not include compounds containing epoxide groups. In some embodiments, solubility switching compounds do not include compounds containing a bisazide moiety.

The solubility switching compound (SSC) can play an important role in the dissolution rate of unexposed films made from a photosensitive composition described herein and can enhance or reduce the solubility of such an unexposed coated film of this disclosure. In some embodiments, the solubility switching compound (SSC) increases the dissolution rate of an unexposed film prepared from the photosensitive composition of this disclosure in a developer (e.g., cyclopentanone). After exposure to actinic radiation, the exposed portion of the film can have a low dissolution rate in a developer (e.g., due to cross-linking), thereby creating a large contrast in dissolution rates between exposed and unexposed portions of the film. As such, the unexposed portion of the film can be removed by dissolving in the developer to form a film having patterned relief. In some embodiments, the solubility switching compound (SSC) decreases the dissolution rate of an unexposed film prepared from the photosensitive composition of this invention. In such embodiments, the film may still be able to form a patterned relief after exposure to actinic radiation if the contrast in dissolution rates between exposed and unexposed portions of the film is sufficiently large.

In some embodiments, a photoinitiator (i.e., component (C)) is a compound capable of initiating a reaction between the functional groups of the solubility switching compound (SSC) or between a functional group of an SSC and the second functional group of optionally end-capped polymers, when the composition, or a portion of the composition, is exposed to actinic radiation. Some photoinitiators used in the composition function by generating free radicals after absorbing light at the wavelength of exposure.

Specific examples of initiators that generate free radicals when exposed to high energy radiation (also known as photoinitiators) include, but are not limited to, NCI-831 (Available from ADEKA Corp.), 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis(2,4,6-trimethyl benzoyl)phenyl phosphine oxide (Irgacure 819 from BASF), 2-methyl-1-[4-(methylthio)phenyl]-2-morphorinopropane-1-on (Irgacure 907 from BASF), (2,4,6-trimethylbenzoyl)diphenyl phosphine oxide (Lucerin TPO from BASF), ethoxy(2,4,6-trimethylbenzoyl)phenyl phosphine oxide (Lucerin TPO-L from BASF), a blend of phosphine oxide, hydroxy ketone and a benzophenone derivative (ESACURE KTO46 from Sartomer), 2-hydroxy-2-methyl-1-phenylpropane-1-on (Darocur 1173 from Merck), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators are (5-toluylsulfonyloxyimino-5H-thiophen-2-ylidene)-2-methylphenyl-acetonitrile (Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl) diazomethane, 1-p-toluenesulfonyl-1-cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

Alternatively, a combination of a photosensitizer and an initiator (e.g., an initiator not activated by actinic radiation) may be used in the photosensitive composition. In this alternative, a photosensitizer absorbs the light and transfers energy to the initiator to start reactions with the SSC. Examples of photosensitizers include, but are not limited to, 9-methylanthracene, anthracenemethanol, acenaphthylene, thioxanthone, methyl-2-naphthyl ketone, 4-acetylbiphenyl, and 1,2-benzofluorene.

Specific examples of initiators that can be activated by a sensitizer include, but are not limited to, benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, di(n-propyl) peroxydicarbonate, 2,2-azobis(isobutyronitrile), 2,2-azobis (2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

Suitable solvents (i.e., component (D)) useful in the photosensitive compositions of this disclosure can include alcohols, ketones, lactones, ethers, amides, imides and esters. The solvent typically should dissolve all components of the composition, cast a good film and should not interfere with the combining reaction (e.g., crosslinking reaction between components (A) and (B)) of the composition. Suitable examples of organic solvents include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol, 2,5-dimethyl ether (2,5-dimethylisosorbide), 1,4:3,6-dianhydrosorbitol 2,5-diethyl ether (2,5-diethylisosorbide) and mixtures thereof. Preferred organic solvents are gamma-butyrolactone (GBL), cyclopentanone (CP), cyclohexanone, N-methyl-2-pyrrolidone (NMP), and dimethylsulfoxide (DMSO). These solvents can be used individually or in combination.

In some embodiments, the amount of polyimide (A) is from about 5 to about 50 weight % (e.g., from about 10 to about 45 weight % or from about 20 to about 40 weight %) of the entire weight of the photosensitive composition.

In some embodiments, the amount of component (B) (SSC) having at least one reactive functional group is at least about 1 weight % (e.g., at least about 2 weight %, at least about 3 weight %, at least about 4 weight %, or at least about 5 weight %) and/or at most about 25 weight % (e.g., at most about 20 weight %, at most about 15 weight %, or at most about 10 weight %) of the entire weight of the photosensitive composition.

In some embodiments, the amount of solubility switching compound (SSC) is at most about 60 wt % (e.g., at most about 55 wt %, at most about 50 wt %, at most about 45 wt %, at most about 40 wt %, or at most about 35 wt %) of the amount of the polyimide polymer. If the amount of solubility switching compound (SSC) is higher than about 60 wt % of the amount of the polyimide polymer, it is believed that the mechanical properties as well as chemical resistance of the film made from such a polymer will suffer and coating defects and tackiness of film due to lower viscosity can be observed.

In some embodiments, the amount of solubility switching compound (SSC) is at least about 10 wt % (e.g., at least about 15 wt %, at least about 20 wt %, at least about 25 wt %, or at least about 30 wt %) of the amount of the polyimide polymer. If the amount of solubility switching compound (SSC) is less than about 10 wt % of the amount of the polyimide polymer, it is believed that there will be poor contrast between exposed and unexposed areas of the film made from such a polymer and lithographic performance of the film will suffer greatly.

In some embodiments, the amount of component (C) (photoinitiator) is from about 0.0001 to about 20 weight % (e.g., from about 0.01 to about 15 weight % or from about 1 to about 10 weight %) of the entire weight of the photosensitive composition.

In some embodiments, the amount of component (D) (Solvent) is from about 20 to about 98 weight % (e.g., from about 50 to about 95 weight % or from about 60 to about 90 weight %) of the entire weight of the photosensitive composition.

Other additives including, but not limited to, adhesion promoters, surfactants, nanoparticles, and plasticizers can be added to the photosensitive composition of this disclosure. The amounts of these additional additives can range from 0 wt % to about 15 wt % based on the entire weight of the composition.

Suitable adhesion promoters are described in "Silane Coupling Agent" Edwin P. Plueddemann, 1982 Plenum Press, New York. Classes of adhesion promoters include, but are not limited to, vinylalkoxysilanes, methacryloxy-alkoxyysilanes (e.g. 3-methacryloxypropyldimethoxymethylsilane, and 3-methacryloxypropyltrimethoxysilane), mercaptoalkoxysilanes, aminoalkoxysilanes, epoxyalkoxysilanes and glycidyloxyalkoxysilanes. Examples of suitable adhesion promoters include but not limited to gamma-aminopropyltrimethoxysilane, gamma-glycidyloxypropylmethyldimethoxysilane, gamma-glycidyloxypropyl-methyldiethoxysilane, glycidyloxypropyltrimethoxysilane, and gamma-mercaptopropyl-methyldimethoxysilane.

In some embodiments, the adhesion promoter contains a silicon compound without a thiol group. In some embodiments, the adhesion promoter contains a silicon compound without an acrylic moiety. In some embodiments, the adhesion promoter contains a silicon compound without an epoxy group.

The concentration of the optional adhesion promoter, if employed, ranges from about 0.1 wt % to about 5 wt % of total weight of the photosensitive composition. In some embodiments, the amount of adhesion promoter is from about 0.2 wt % to about 1.5 wt % of the total weight of the composition. In some embodiments, the amount of adhesion promoter is from about 0.3 wt % to about 1 wt % of the total weight of the composition.

The photosensitive compositions of this disclosure can also optionally contain at least one surfactant. If a surfactant is employed, it can be added from about 0.001 wt % to about 2 wt % (e.g., from about 0.01 wt % to about 1 wt %) based on the total weight of the photosensitive compositions of this disclosure. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

The photosensitive compositions of the present disclosure can optionally contain at least one plasticizer. The amount of the optional plasticizer, if employed, can range from about 1 wt % to about 10 wt % of the total weight of the composition. In some embodiments, the amount of the plasticizer ranges from about 2 wt % to about 10 wt % of the total weight of the composition.

In some embodiments, the photosensitive compositions can further include at least one nanoparticle (e.g., a plurality of nanoparticles). The nanoparticle can be made from one or more polymers, inorganic materials, and/or metals. The nanoparticles suitable for this application are preferably less than 200 μm in diameter and are compatible with the other components of the compositions of this disclosure. Examples of such nanoparticles are found, e.g., in U.S. Pat. Nos. 6,291,070 and 6,844,950, the contents of which are hereby incorporated by reference. Without wishing to be bound by theory, it is believed that the nanoparticles can improve the mechanical properties (e.g., CTE) and electrical properties (e.g., dielectric properties) of the polymeric layer of the dry film structure made by such photosensitive compositions.

Examples of nanoparticles include silica, alumina, titania, zirconia, hafnium oxide, CdSe, CdS, CdTe, CuO, zinc oxide, lanthanum oxide, niobium oxide, tungsten oxide, strontium oxide, calcium titanium oxide, sodium titanate, and potassium niobate. The nanoparticles can be surface treated or untreated nanoparticles.

In some embodiments, the photosensitive compositions of the present disclosure include a second polymer which forms a continuous phase with the polyimide polymer described above. In some embodiments, the compositions of the present disclosure are substantially free of a polymer which forms a discontinuous phase with the polyimide polymer described above.

This disclosure also features a photosensitive film having a dissolution rate in cyclopentanone of greater than about 0.15 microns/second (1500 Å/second) (e.g., greater than about 0.20 microns/second (2000 Å/second), greater than about 0.25 microns/second (2500 Å/second), greater than about 0.30 microns/second (3000 Å/second), greater than about 0.35 microns/second (3500 Å/second) or greater than about 0.40 microns/second (4000 Å/second)) and/or less than about 1.4 microns/second (14000 Å/second) (e.g. less than about 1.2 microns/second (12000 Å/second), less than about 1.0 microns/second (10000 Å/second), less than about 0.8 microns/second (8000 Å/second), or less than about 0.6 microns/second (6000 Å/second)). Such a film can be formed from a photosensitive composition containing a polyimide having a weight average molecular weight (Mw) of at least about 20,000 Daltons (e.g., at least about 25,000 Daltons, at least about 30,000 Daltons, at least about 35,000 Daltons, at least about 40,000 Daltons, or at least about 45,000 Daltons) and/or at most about 70,000 Daltons (e.g. at most about 65,000 Daltons, at most about 60,000 Daltons, at most about 55,000 Daltons, or at most about 50,000 Daltons), a solubility switching compound (SSC), and a photoinitiator.

In some embodiments, the dissolution rate of the photosensitive film in cyclopentanone is from about 0.15 microns/second (1500 Å/second) to at most about 0.40 microns/second (4000 Å/second) (e.g., at most about 0.35 microns/second (3500 Å/second), at most about 0.30 microns/second (3000 Å/second), at most about 0.25 microns/second (2500 Å/second), or at most about 0.20 microns/second (2000 Å/second)).

In some embodiments, the dissolution rate of the photosensitive film in cyclopentanone is from about 0.20 microns/second (2000 Å/second) to at most about 0.40 microns/second (4000 Å/second) (e.g., at most about 0.35 microns/second (3500 Å/second), at most about 0.30 microns/second (3000 Å/second), or at most about 0.25 microns/second (2500 Å/second)).

In some embodiments, the dissolution rate of the photosensitive film in cyclopentanone is from about 0.25 microns/second (2500 Å/second) to at most about 0.40 microns/second (4000 Å/second) (e.g., at most about 0.35 microns/second (3500 Å/second), or at most about 0.30 microns/second (3000 Å/second)).

In some embodiments, the dissolution rate of the photosensitive film in cyclopentanone is from about 0.30 microns/second (3000 Å/second) to at most about 0.40 microns/second (4000 Å/second) (e.g., at most about 0.35 microns/second (3500 Å/second)).

In some embodiments, the dissolution rate of the photosensitive film in cyclopentanone is from about 0.35 microns/second (3500 Å/second) to about 0.40 microns/second (4000 Å/second).

In some embodiments, the dissolution rate of the photosensitive film in cyclopentanone is from about 0.6 microns/second (6000 Å/second) to at most about 1.40 microns/second (14000 Å/second) (e.g., at most about 1.2 microns/second (12000 Å/second), at most about 1.0 microns/second (10000 Å/second), or at most about 0.80 microns/second (8000 Å/second)).

In some embodiments, the dissolution rate of the photosensitive film in cyclopentanone is from about 0.80 microns/second (8000 Å/second) to at most about 1.40 microns/second (14000 Å/second) (e.g., at most about 1.2 microns/second (12000 Å/second) or at most about or 1.0 microns/second (10000 Å/second)).

In some embodiments, the dissolution rate of the photosensitive film in cyclopentanone is from about 1.0 microns/second (10000 Å/second) to at most about 1.40 microns/second (14000 Å/second) (e.g., at most about 1.2 microns/second (12000 Å/second)).

In some embodiments, the dissolution rate of the photosensitive film in cyclopentanone is from about 1.2 microns/second (12000 Å/second) to about 1.40 microns/second (14000 Å/second).

In some embodiments, after exposed to actinic radiation, the photosensitive film described herein can have—a dissolution rate in cyclopentanone of less than about 0.02 microns/second (200 Å/second) (e.g., less than about 0.015 microns/second (150 Å/second), less than about 0.01 microns/second (100 Å/second) or less than about 0.005 microns/second (50 Å/second)).

The contrast of the photosensitive film is defined as the ratio of dissolution rate of the unexposed area divided by the dissolution rate of the exposed area. In some embodiments, the photosensitive film described herein can have a contrast of higher than about 7.5 (e.g., higher than about 10, higher than about 15, higher than about 20, higher than about 25, higher than about 30, or higher than about 35).

The present disclosure also features a lithographic process to prepare patterned relief images using the photosensitive compositions described herein. In such embodiments, the compositions described herein can be used as negative photosensitive resin compositions. In such embodiments, the process can include: (a) coating a substrate with a composition of the present disclosure to form a coated substrate having a film (e.g., a tacky film) on the substrate; and (b) baking the coated substrate (e.g., at a temperature from about 50° C. to about 150° C.) in a first baking step to form a coated substrate with a dried film. The film thus formed can have a dissolution rate in cyclopentanone of greater than about 0.15 microns/second (1500 Å/second) (e.g., greater than about 0.20 microns/second (2000 Å/second), greater than about 0.25 microns/second (2500 Å/second), greater than about 0.30 microns/second (3000 Å/second), or greater than about 0.35 microns/second (3500 Å/second)). The process can further include one or more of the following steps: (1) exposing the dried film to radiation through a mask or a template to form a coated substrate with a dried, pattern-wise exposed film; (2) optionally, baking in a second baking step the coated substrate with a dried, pattern-wise exposed film (e.g., at a temperature from about 50° C. to about 150° C.), in which the exposed portions of the film are crosslinked or cured; (3) developing a portion of the dried, pattern-wise exposed film with a developer (e.g., containing a solvent or a mixture of solvents) to produce a relief image on the substrate (e.g., by contacting the developer with at least some of the unexposed portions of the film); (4) optionally, rinsing the relief image on the substrate with a solvent or a mixture of solvents; and (5) optionally, baking the substrate having a relief image (e.g., at a temperature from about 50° C. to about 200° C.) in a third baking step.

In some embodiments, at the end of the exposing step, the contrast can be higher than about 10 (e.g., higher than about 15, higher than about 20, higher than about 25, higher than about 30, or higher than about 35).

In some embodiments, the exposed photosensitive film has a dissolution rate in cyclopentanone of less than about 0.02 microns/second (200 Å/second) (e.g., less than about 0.015 microns/second (150 Å/second), less than about 0.01 microns/second (100 Å/second), or less than about 0.005 microns/second (50 Å/second)).

In some embodiments, the coating of the substrate can be done by any suitable method, including, but not limited to, spin coating, slit coating, spray coating, dip coating and ink-jetting. One skilled in the art will know which coating method is appropriate for a given application.

In some embodiments, the baking steps can be done using contact or proximity heating on a hotplate at a fixed temperature or by ramping the temperature at a rate of 1-20° C./minute. In some embodiments, the baking steps can be done in an oven at a fixed temperature or by ramping the temperature at a rate of 1-20° C./minute either under vacuum or at atmospheric pressure. Irrespective of the baking method used, the baking steps can be performed in either a single step or multiple steps. Examples of suitable baking means include, but are not limited to, hotplates, infrared lamps, convection ovens, and thermal heating elements on ink jet printing heads. One skilled in the art will know which baking method is appropriate for a given application.

In some embodiments, the exposure step can be performed using light, or other actinic radiation (e.g., ultraviolet light, visible light, electron beam radiation, or X-rays), as is suitable for the initiator in the specific composition. The use of i-line (365 nm), h-line (405 nm), or g-line (436 nm) UV light is preferred. In general, the exposure step can result in change in the dissolution rate of exposed areas. One skilled in the art will know which type of high energy radiation is appropriate for a given application.

In some embodiments, after exposure of the film to light or other actinic radiation through a mask or template, unexposed portions are removed by using a developer to form a pattern. In some embodiments, examples of developers include an organic solvent or a mixture of organic solvents. Developers are not limited to cyclopentanone. Suitable examples of developers include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, N,N-diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol, 1,4:3,6-dianhydrosorbitol, isosorbide dimethyl ether, 1,4:3,6-dianhydrosorbitol 2,5-diethyl ether (2,5-diethylisosorbide) and mixtures thereof. Preferred developers are gamma-butyrolactone (GBL), cyclopentanone (CP), cyclohexanone, isosorbide dimethyl ether, ethyl lactate (EL), n-butyl acetate (nBA) and dimethylsulfoxide (DMSO). More preferred developers are gamma-butyrolactone (GBL), cyclopentanone (CP) and cyclohexanone. These developers can be used individually or in combination of two or more to optimize the image quality for the particular composition and lithographic process.

In some embodiments, the development can be carried out by any suitable method such as spraying the developer described above on the exposed film, immersing the substrate in the developer, on track development by puddle, or applying ultrasonic waves to the substrate while immersing in the developer, spraying the developer while rotating the substrate, or the like. One skilled in the art will know which development method is appropriate for a given application. Development times can range from about 20 seconds to about three minutes. In some embodiments, the development time can range from about 30 seconds to about 2 minutes. In some embodiments, the development time can range from about 45 seconds to about 90 seconds. In some embodiments, multiple development steps can be employed. In some embodiments, two or three development steps can be employed. In some embodiments, two or three development steps are employed where each development step takes from about 25 seconds to about 45 seconds.

In some embodiments, after the development, an optional rinse treatment can be carried out with an organic rinse solvent. One skilled in the art will know which rinse method is appropriate for a given application. Suitable examples of organic rinse solvents include, but are not limited to, alcohols such as isopropyl alcohol, methyl isobutyl carbinol (MIBC), propylene glycol monomethyl ether (PGME), amyl alcohol, esters such as n-butyl acetate (nBA), ethyl lactate (EL) and propylene glycol monomethyl ether acetate (PGMEA), ketones such as cyclopentanone (CP) and cyclohexanone, and mixtures thereof. A rinse solvent can be used to carry out the rinse treatment to remove residues.

In some embodiments, the first baking step temperature is from about 50° C. to about 120° C. In some embodiments, the first baking step temperature is from about 70° C. to about 120° C. In some embodiments, the first baking step temperature is from about 80° C. to about 120° C. One skilled in the art will know what baking means is appropriate for a given application.

In some embodiments, a second baking step can be incorporated before developing. In some embodiments, the second baking step temperature is from about 40° C. to about 150° C. In some embodiments, the second baking step temperature is from about 50° C. to about 120° C. In some embodiments, the second baking step temperature is from about 50° C. to about 110° C.

In some embodiments, a third baking step can be incorporated after developing. In some embodiments, the third baking step temperature is from about 100° C. to about 200° C. In some embodiments, the third baking step temperature is from about 120° C. to about 180° C.

In some embodiments, the thickness of the film formed on a substrate is preferably from about 0.5 µm to about 200 µm. The appropriate film thickness employed will be determined by the specific application.

Dry Film

Some embodiments of this disclosure relate to a dry film structure that includes a carrier substrate and a polymeric layer (e.g., a photosensitive polymeric layer) supported by the carrier substrate. The polymeric layer can be formed from a photosensitive composition described herein (such as a photosensitive composition containing components (A), (B), and (C) described above) in which the dissolution rate of the polymeric layer in cyclopentanone is greater than about 0.15 microns/second. In some embodiments, the dry film can further include a protective layer such that the polymeric layer is between the carrier substrate and the protective layer.

In some embodiments, this disclosure features methods of preparation of a dry film structure. The method includes: (a) coating a carrier substrate with a composition containing at least one polyimide polymer as described earlier, at least one solubility switching compound (SSC), at least one initiator and at least one solvent, (b) drying the coated composition to form a first polymeric layer (e.g., a photosensitive polymeric layer), and (c) optionally applying a protective layer to the first polymeric layer to form a dry film structure.

In some embodiments, the carrier substrate is a single or multiple layer film, which optionally has undergone treatment to modify the surface of the film that will contact the first polymeric layer of the dry film structure. In some embodiments, one or more layers of a multilayer carrier substrate can contain particles. Examples of particles include, but are not limited to, inorganic particles such as silicon dioxide particles (aggregated silica and the like), calcium carbonate particles, alumina particles, titanium oxide particles, and barium sulfate particles; organic particles such as crosslinked polystyrene particles, acrylic particles, and imide particles; and their mixtures. Without wishing to be bound by theory, it is believed that the particles can improve the adhesion properties of the carrier substrate, and can improve the uniformity of the first polymeric layer coated on the carrier substrate.

In some embodiments, the carrier substrate has excellent optical transparency and is substantially transparent to actinic irradiation used to form a relief pattern in the first polymeric layer. In some embodiments, the carrier substrate can possess low surface roughness. The carrier substrate in general should be sufficiently strong and they should be insoluble in the solvent used to form the first polymeric layer. The carrier substrate can be removed from the remainder of the dry film structure (e.g., the first polymeric layer) in subsequent use, or can form part of the final structure of the fabricated device. In situations where the carrier substrate is eventually removed from the final device, such as by peeling, adhesion between the carrier substrate and the first polymeric layer should be weak enough to allow for ease of separation. In such embodiments, the carrier substrate can include a release layer on the surface to be coated by the first polymeric layer to facilitate removal of the carrier substrate. In cases in which the carrier substrate is part of the final device, adhesion should be high to prevent peeling of the carrier substrate.

As specific examples of the carrier substrate, there may be various plastic films such as polyethylene terephthalate (PET), polyethylene naphthalate, polypropylene, polyethylene, cellulose tri-acetate, cellulose di-acetate, poly(metha)acrylic acid alkyl ester, poly(metha)acrylic acid ester copolymer, polyvinylchloride, polyvinyl alcohol, polycarbonate, polystyrene, cellophane, polyvinyl chloride copolymer, polyamide, polyimide, vinyl chloride-vinyl acetate copolymer, polytetrafluoroethylene, polytrifluoroethylene, and the like. In addition, a combination material containing two or more plastic films or two or more polymers can be used. Polyethylene terephthalate (PET) film having excellent optical transparency is particularly preferable. The thickness of the carrier substrate can be in the range of at least about 10 microns (e.g., at least about 15 microns, at least about 20 microns, at least about 30 microns, at least about 40 microns, at least about 50 microns or at least about 60 microns) to at most about 150 microns (e.g., at most about 140 microns, at most about 120 microns, at most about 100 microns, at most about 90 microns, at most about 80 microns, or at most about 70 microns). The Young's modulus of the carrier substrate can be in the range of at least about 100 MPa (e.g., at least about 150 MPa, at least about 200 MPa, or at least about 250 MPa) to at most about 500 MPa (e.g., at most about 450 MPa, at most about 400 MPa, or at most about 350 MPa).

The carrier substrate can be used with or without corona treatment. Corona is ionized air created by discharging high frequency high voltage energy across a metal or insulated electrode. This electrode is positioned over a grounded roll. The corona treatment of films can optimize surfaces for adhesion by removing surface contaminants, creating bonding sites and raising the surface energy. In some embodiments, corona treatment can be done during winding of the carrier substrate film to form a roll by passing the film through a corona process. This produces pretreated corona film. Such corona treated carrier substrate films are commercially available. Another option is "online corona treatment" where the carrier substrate film is passed through a corona chamber just before coating of the first polymeric layer composition onto the carrier substrate. On line corona treatment of carrier substrates can improve print quality, eliminates pinholing in coating, and increases dry film structure productivity.

The coating method to form the first polymeric layer of the dry film structure is not particularly limited. For example, methods such as spray coating, roll coating, rotation coating, slit coating, compression coating, curtain coating, die coating, wire bar coating, and knife coating can be used to form the first polymeric layer. The drying temperature used to form the first polymeric layer can vary according to the components, the organic solvent, and the content ratio. In some embodiments, drying is carried out at a temperature of at least about 60° C. (e.g., at least about 65° C., at least about 70° C. or at least about 75° C.) to at most about 120° C. (e.g., at most about 105° C., at most about 90° C. or at most about 85° C.) for at least about 30 seconds (e.g., at least about 1 minute, at least about 2 minutes, at least about 4 minutes or at least about 6 minutes) to at most about 15 minutes (e.g., at most about 12 minutes, at most about 10 minutes, or at most about 8 minutes). An example of the drying means is a convection oven using hot air, but any suitable heating means can be employed.

The thickness of the first polymeric layer of the dry film structure of the present disclosure is not particularly limited. The thickness is at least about 2 microns (e.g., at least about 5 microns, at least about 10 microns, at least about 20 microns, at least about 25 microns, at least about 30 microns, at least about 35 microns or at least about 40 microns) and/or at most about 100 microns (e.g., at most about 90 microns, at most about 80 microns, at most about 70 microns, at most about 60 microns, at most about 50 microns or at most about 45 microns). In some embodiments, the first polymeric layer can have a relatively small thickness. In such embodiments, the first polymeric layer can have a thickness of at most about 5 microns (e.g., at most about 4 microns, or at most about 3 microns).

In some embodiments, melt viscosity and melting point can be important thermal properties of the above described first polymeric layer. Both of these properties can be critical for effective lamination of the dry film structure onto a substrate.

In some embodiments, the dry film structure contains a first polymeric layer having a melt viscosity of at least about 10 poise (e.g., at least about 20 poise, at least about 30 poise, at least about 40 poise or at least about 50 poise) and/or at most about 150 poise (e.g., at most about 140 poise, at most about 130 poise, at most about 120 poise, at most about 110 poise, at most about 100 poise or at most about 90 poise) at a temperature from about 60° C. to about 140° C. Without wishing to be bound by theory, it is believed that, when melt viscosity of the first polymeric layer is too low, over-flowing of the first polymeric layer can occur during lamination. This results in inconsistent film thickness of the laminated film and contamination of the backside of substrate. When the melt viscosity is too high, polymer flow can be unusually slow which results in voids and air-bubbles in the layer thus formed. Moreover, if the carrier substrate is patterned, low polymer flow can cause incomplete and improper filling of the patterns.

In some embodiments, the first polymeric layer has a melting point of at least about 60° C. (e.g., at least about 65° C., at least about 70° C., at least about 75° C., or at least about 80° C.) and/or at most about 140° C. (e.g. at most about 135° C., at most about 130° C., at most about 125° C., or at most about 120° C.). Without wishing to be bound by theory, it is believed that, when the melting point of the first polymeric layer is too low, formation of a dry film can be hindered to such a degree that the formation of the dry film stack, typically by a continuous process, is hindered. When the melting point is too high, a high temperature is needed during lamination of the first polymeric layer and the carrier substrate and high temperature can cause the carrier substrate to be melted, thereby ruining the dry film stack. In addition, when a first polymeric layer with a high melting point is used in a lower temperature lamination process, the first polymeric layer can have poor adhesion with the carrier layer.

In some embodiments, the dry film structure includes an optional protective layer (e.g., a protective film or a protective cover sheet) so that the first polymeric layer is disposed between the protective layer and the carrier substrate. The protective layer can protect the first polymeric layer during transit and storage, and keeping the tacky first polymeric layer from sticking to itself. In some embodiments, the protective layer is a single or multiple layer film which optionally has undergone treatment to modify the surface of the film that will contact the first polymeric layer of the dry film structure. The protective layer can be made from polyethylene, polypropylene, or any other suitable polymer. In some embodiments, adhesion of the protective layer to the first polymeric layer is less than that of the carrier substrate to the first polymeric layer. This allows for easy separation of the protective layer from the first polymeric layer without also separating the first polymeric layer from the carrier substrate. The protective layer can be laminated to the first polymeric layer by a roll compression method.

In some embodiments, the protective layer can have a Young's modulus in the range of at least about 100 MPa (e.g., at least about 150 MPa, at least about 200 MPa, or at least about 250 MPa) to at most about 500 MPa (e.g., at most about 450 MPa, at most about 400 MPa, or at most about 350 MPa).

In general, the dry film structure described herein can be used to laminate the first polymeric layer to a substrate (e.g., an electronic substrate). In some embodiments, the first polymeric layer of the dry film structure can be laminated to any type of substrates (e.g., electronic substrates) using a differential pressure laminator where vacuum, heat, and pressure are combined for voidless lamination. Examples of suitable electronic substrates include a silicon substrate, a copper substrate, an aluminum substrate, a silicon oxide substrate, a silicon nitride substrate, a glass substrate, an organic laminate substrate, or a dielectric material substrate. For example, the protective layer of the dry film structure can be peeled off, and the remainder of the structure (e.g., a first polymeric layer on a carrier substrate) can then be cut to the substrate size. As another example, the dry film structure can first be cut to the substrate size and then the protective layer can be peeled off to laminate the first polymeric layer onto a substrate. In some embodiments, these substrates, pre-laminated either manually or with the assistance of currently available dispensing equipment, are placed on the slide mounted platen or positioned in a chamber. Substrates varying in thickness and geometry can be intermixed to increase throughput. The substrate can then be exposed to a vacuum dwell for a time determined by an integral precision digital timer. Following this period, a preheated silicone rubber diaphragm can descend onto the work piece. This action can close the small gap below the spring-mounted platen assembly and provides direct thermal contact with the lower heat platen. The temperatures of both the upper and lower heated platens can be controlled independently by integral temperature controllers. Differential pressure laminator generally permits the addition of positive pressure above the diaphragm, increasing the effective lamination pressure dramatically. The pressure dwell period can be adjusted with a timer identical to that employed in the vacuum dwell. Upon completion of a cycle, the drawer mechanism can be retracted and the laminated substrate can be removed for further processing.

In some embodiments, the first polymeric layer can be laminated to a substrate through a vacuum lamination at about 60° C. to about 140° C. after pre-laminating of the first polymeric layer of the dry film structure with a plane compression method or a hot roll compression method. When the hot roll lamination is employed, the dry film structure can be placed into a hot roll laminator, the protective layer can be peeled away from the first polymeric layer/carrier substrate, and the first polymeric layer can be brought into contact with and laminated to a substrate using rollers with heat and pressure.

In some embodiments, the lamination temperature used in the lamination process described above is at least about 50° C. (e.g., at least about 70° C., at least about 80° C., at least about 90° C., or at least about 100° C.) to at most about 220° C. (e.g., at most about 190° C., at most about 160° C., at most about 130° C., or at most about 110° C.). The pressure used in the lamination process described above is at least about 1.5 psi (e.g., at least about 3 psi, at least about 5 psi, at least about 10 psi, at least about 15 psi, or at least about 20 psi) to preferably at most about 70 psi (e.g., at most about 60 psi, at most about 50 psi, at most about 40 psi, or at most about 30 psi). The vacuum used in the lamination process described above can be at least about 0.2 Torr to at most about 5 Torr. The speed of the roller used in the lamination process described above can be at least about 1 cm/min (e.g., at least about 5 cm/min, at least about 10 cm/min, at least about 25 cm/min, or at least about 50 cm/min) to at most about 600 cm/min (e.g., at most about 500 cm/min, at most about 400 cm/min, at most about 300 cm/min at most about 200 cm/min, or at most about 100 cm/min).

In some embodiments, this disclosure features a process of forming a laminate. The process can include (a) removing the protective layer from the dry film structure described herein if the protective layer is present in the dry film structure; and (b) applying the film structure obtained in step (a) onto an electronic substrate to form a laminate. In some embodiments, the process can further include converting the first polymeric layer into a patterned layer. The conversion can include exposing the first polymeric layer in the laminate to actinic radiation. In such embodiments, the conversion can further include removing the carrier substrate before or after exposing the first polymeric layer. After the first polymeric layer is exposed to actinic radiation, the conversion can further include developing the exposed first polymeric layer to form a patterned layer having a relief pattern.

In some embodiments, the laminated first polymeric layer on an electronic substrate is exposed through a desired patterned photomask such that the exposed areas in the first polymeric layer is crosslinked. Examples of active energy beams used for exposure include electron beams, ultraviolet light and X-ray, with ultraviolet light being preferable. As a light source, it is possible to use a low-pressure mercury lamp, high-pressure mercury lamp, extra-high-pressure mercury lamp, halogen lamp, etc. The exposure dose is typically from about 100 mJ/cm$^2$ to about 1,000 mJ/cm$^2$.

The carrier substrate can be removed by peeling before or after the exposure.

After the exposure, the first polymeric layer of the dry film structure can be heat treated to at least about 50° C. (e.g., at least about 55° C., at least about 60° C., or at least about 65° C.) to at most about 100° C. (e.g., at most about 95° C., or at most about 90° C., at most about 85° C., at most about 80° C., at most about 75° C., or at most about 70° C.) for at least about 60 seconds (e.g., at least about 65 seconds, or at least about 70 seconds) to at most about 240 seconds (e.g., at most about 180 seconds, at most about 120 seconds or at most about 90 seconds). The heat treatment is usually accomplished by use of a hot plate or oven.

After the exposure, the first polymeric layer of the dry film structure can be developed to remove unexposed portions by using a developer. Development can be carried out by, for example, an immersion method or spraying method. Microholes and fine lines can be generated in the photosensitive first polymeric layer on the laminated substrate after development.

Examples of developers suitable for developing the first polymeric layer can be the same developers listed above in the lithographic process for the photosensitive compositions.

In some embodiments, the developer and the polyimide polymer in the first polymeric layer can have a relative energy difference (RED) of at most about 3 (e.g., at most about 2.5, at most about 2, at most about 1.5, or at most about 1) and/or at least about 0.1 (e.g., at least about 0.2, at least about 0.5, at least about 0.7, or at least about 1). As used herein, "RED" refers to the ratio of distance between Hansen parameters (Ra) and the interaction radius (Ro). In general, the lower the RED, the better solubility the polyimide polymer has in the solvent. Ra is defined by the following formulation: $(Ra)^2=4(\delta_{d2}-\delta_{d1})^2+(\delta_{p2}-\delta_{p1})^2+(\delta_{h2}-\delta_{h1})^2$ in which $\delta_d$, $\delta_p$ and $\delta_h$ are respectively the energy between dispersion, intermolecular force and hydrogen bonds between molecules. Ra determines the radius of the sphere in Hansen space and its center is the three Hansen parameters. More detail on Hansen parameters can be found in the following reference: "Hansen, Charles (2007). Hansen Solubility Parameters: A user's handbook, Second Edition. Boca Raton, Fla.: CRC Press. ISBN 978-0-8493-7248-3".

In some embodiments, after the development, an optional rinse treatment can be carried out with an organic rinse solvent. Suitable examples of organic rinse solvents can be the same as mentioned above in the lithographic process embodiment for the photosensitive compositions.

In some embodiments, after the development step or the optional rinse treatment step, an optional baking step (i.e., post development bake) can be carried out at a temperature ranging from at least about 120° C. (e.g., at least about 130° C., at least about 140° C., at least about 150° C., at least about 160° C., at least about 170° C., or at least about 180° C.) to at most about 250° C. (e.g., at most about 240° C., at most about 230° C., at most about 220° C., at most about 210° C., at most about 200° C. or at most about 190° C.). The baking time is at least about 5 minutes (e.g., at least about 10 minutes, at least about 20 minutes, at least about 30 minutes, at least about 40 minutes, at least about 50 minutes, or at least about 60 minutes) and/or at most about 5 hours (e.g., at most about 4 hours, at most about 3 hours, at most about 2 hours, or at most about 1.5 hours). This baking step can remove residual solvent from the remaining first polymeric layer and can further crosslink the remaining first polymeric layer. Post development bake can be done in air or preferably, under a blanket of nitrogen and may be carried out by any suitable heating means.

In some embodiments, the resulting baked first polymeric layer after the baking step has a glass transition temperature of at least about 180° C. (e.g., at least about 190° C., at least about 200° C. or at least about 210° C.). In some embodiments, the resulting baked first polymeric layer after the post development baking step has a glass transition of at most about 320° C. (e.g., at most about 310° C., at most about 300° C. or at most about 290° C.). As used herein, the glass transition temperature of the first polymeric layer is defined as the first inflection point on a thermo-mechanical analyzer curve plotting dimension change (μ) vs temperature.

In some embodiments, a high glass transition temperature for the baked first polymeric layer can be desirable to prevent film mobility during subsequent processing steps of device manufacture and subsequent device use for longer device life. Some manufacturing processing steps such as soldering require elevated temperatures. High glass transition temperature for the baked first polymeric layer can help maintain mechanical integrity of the resulting devices.

In general, the processes described above can be used to form an article to be used in a semiconductor device. Examples of such articles include a semiconductor substrate, a flexible film for electronics, a wire isolation, a wire coating, a wire enamel, or an inked substrate. Examples of semiconductor devices that can be made from such articles include an integrated circuit, a light emitting diode, a solar cell, and a transistor.

In some embodiments, this disclosure features a three dimensional object containing at least one patterned film formed by a process described herein. In some embodiments the three dimensional object can include patterned films in at least two stacks (e.g., at least three stacks).

In some embodiments, the processes described above result in an article that includes an electronic substrate and a patterned layer (e.g., containing a relief pattern) laminated onto the electronic substrate, in which the patterned layer includes at least one polyimide polymer. In embodiments where the initial film thickness is 5 microns or less, the patterned layer thus formed can have a film thickness of less than 5 microns (e.g., at most about 4 microns or at most about 3 microns) and include at least one element having a feature size of at most about 3 microns (e.g. at most 2 microns).

In some embodiments, the patterned layer can have a Young's modulus of at least about 1 GPa (e.g., at least about 2 GPa, at least about 3 GPa, at least about 4 GPa, or at least about 5 GPa) to at most about 20 GPa (e.g., at most about 18 GPa, at most about 16 GPa, at most about 14 GPa, at most about 12 GPa, or at most about 10 GPa). In some embodiments, the patterned layer can have a Young's modulus that is about 200% to about 300% as high as the Young's modulus of the first polymeric layer of the dry film structure.

In some embodiments, the dry film structure described above can further include a second polymeric layer containing at least one water soluble polymer. As defined herein, a "water-soluble" polymer refers to a polymer having a solubility of at least 5% by weight in water at 25° C. Examples of suitable water soluble polymer can be selected from a group consisting of poly(vinyl alcohol), poly(vinyl pyrrolidone), poly(acrylic acid) and the salts thereof, poly(methacrylic acid) and the salts thereof, poly(acrylamide) and the salts thereof, poly(methacrylamide) and the salts thereof, poly(N-isopropylacrylamide) and the salts thereof, poly (2-oxazoline), poly(ethylene oxide), poly(propylene oxide), hydroxyethyl cellulose, hydroxypropyl cellulose, starch, polysaccharides, dextran, cyclodextran, and partially hydrolyzed polyvinyl acetate.

In some embodiments, the second polymeric layer can be between the first polymeric layer and the carrier substrate in the dry film structure. In such embodiments, when the dry film structure is laminated onto an electronic substrate and the carrier substrate is removed, the laminate thus formed includes the electronic substrate, the first polymeric layer (which can be photosensitive), and the second water soluble polymeric layer in the above order. In such embodiments, the second polymeric layer can improve the post exposure delay stability of the first polymeric layer by serving as a protecting layer. In such embodiments, the second polymeric layer can be removed by using water after exposure of the laminate to the actinic radiation and before development.

In some embodiments, the second polymeric layer can be between the first polymeric layer and the protective layer in the dry film structure. In such embodiments, when the dry film structure is laminated onto an electronic substrate and the carrier substrate is removed, the laminate thus formed includes the electronic substrate, the second water soluble polymeric layer, and the first polymeric layer (which can be photosensitive) in the above order. In such embodiments, the second polymeric layer can serve as a protecting layer of the electronic substrate when the electronic substrate is sensitive to an organic developer (e.g., when the electronic substrate is an organic substrate). In such embodiments, after development, part of the water soluble second polymeric layer (i.e., that under the unexposed/developed portion of the first polymeric layer) can be removed by using water, and the rest of second polymeric layer (i.e., that under the exposed/undeveloped portion of the first polymeric layer) can remain in the device thus formed.

The contents of all publications cited herein (e.g., patents, patent application publications, and articles) are hereby incorporated by reference in their entirety.

The following examples are provided to illustrate the principles and practice of the present disclosure more clearly. It should be understood that the present disclosure is not limited to the examples described.

EXAMPLES

Synthesis Example 1 (P-1)

Preparation of 6FDA/DAPI Polyimide

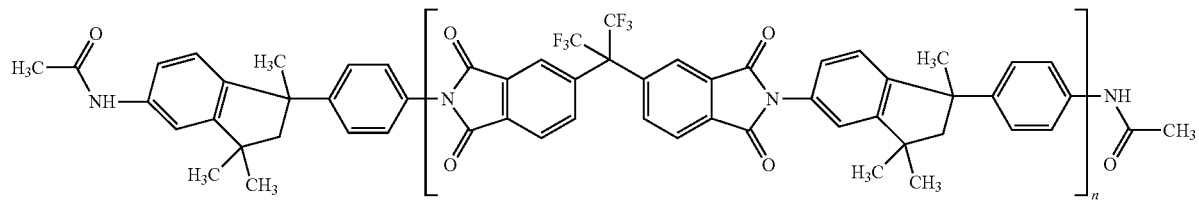

Solid 4,4'-(hexafluoroisopropylidene)bis(phthalic anhydride) (6FDA) (2.370 kg, 5.33 mole) was charged to a solution of 1-(4-aminophenyl)-1,3,3-trimethylindan-5-amine (also known as 4,4'-[1,4-phenylene-bis(1-methylethylidene)]bisaniline (DAPI)) (1.465 kg, 5.51 mole) in NMP (9.86 kg) at 25° C. The reaction mixture temperature was increased to 40° C. and allowed to react for 6 hours. Next, acetic anhydride (1.125 kg) and pyridine (0.219 kg) were added and the reaction mixture temperature was increased to 100° C. and allowed to react for 12 hours.

The reaction mixture above was cooled to room temperature and transferred to a larger vessel equipped with a mechanical stirrer. The reaction solution was diluted with ethyl acetate and washed with water for one hour. After the stirring was stopped, the mixture was allowed to stand undisturbed. Once phase separation had occurred, the aqueous phase was removed. The organic phase was diluted with a combination of ethyl acetate and acetone and washed twice with water. The amounts of organic solvents (ethyl acetate and acetone) and water used in all of the washes are shown in Table 1.

TABLE 1

|  | Wash 1 | Wash 2 | Wash 3 |
|---|---|---|---|
| Ethyl Acetate (kg) | 20.5 | 4.1 | 4.1 |
| Acetone (kg) | — | 2.3 | 2.3 |
| Water (kg) | 22.0 | 26.0 | 26.0 |

GBL (10 kg) was added to the washed organic phase and the solution was concentrated by vacuum distillation to give a polymer solution P-1. The solid % of final polymer was 29.94% and the weight average molecular weight (Mw) measured by GPC was 51,000 Daltons.

To measure the molecular weight by GPC, 200 mg of the above polymer solution was first dissolved in 3.2 g of tetrahydrofuran (THF) that included BHT. The instrument used was a Waters Gel Permeation Chromatograph and the software was Waters Empower 2 Chromatographic software (GPC module). The standard used was five polystyrene standards and one p-cresol dimer standard. Their Mw values were as follows: 198400, 89300, 19100, 4000, and 1200 for polystyrene standards and 228 for p-cresol dimer. The column used was a Phenomenex Guard column: Phenogel-10, 7.8 mm ID×50 mm length and the flow rate was one milliliter per minute at 35° C.

Formulation Example 1 (FE-1)

A photosensitive composition FE-1 was prepared by using 26.72 g of polymer solution (P-1), 4.81 g GBL, 0.48 g of a 0.5 wt % solution of PolyFox 6320 (available from OMNOVA Solutions) in GBL, 0.24 g of gamma-glycidoxypropyltrimethoxysilane, 0.24 g of NCI-831 (trade name, available from ADEKA corporation), 0.02 g para-benzoquinone, 2.70 g of 1,6-hexanediol diacrylate, and 0.9 g pentaerythritol triacrylate. After being stirred mechanically for 24 hours, the solution was filtered by using a 5 micron syringe filter.

General Procedure for Dissolution Rate Measurement

A photosensitive composition was spin coated on 4 silicon wafers to form coatings with a thickness of about 15 microns. The coated wafers were baked at 95° C. for 180 seconds using a hot plate. The wafers were developed by using cyclopentanone for 15, 25, 35 and 65 seconds (one wafer for each development time). 15 milliliters of developer was stream dispensed onto the wafer in 10 seconds to completely cover the film, form a puddle of developer over it, and start puddle development at 25° C. (15, 25, 35 and 65 seconds; the development time listed is the time after the stream dispense stopped). During the dispensing and development steps, the wafer was rotated at a spin speed of 100 RPM. The puddle of developer was removed and the remaining film was dried by spinning for 15 seconds at a spin speed of 3000 RPM. The film thickness loss of each wafer was measured and a graph of thickness loss versus time of development was plotted. The film thickness was measured using a Dektak IIA Profilometer. The data was fitted to a linear function to determine the slope of the line which determined a representative dissolution rate.

Process Example 1

The dissolution rate of photosensitive composition FE-1 was measured according to the general procedure of dissolution rate measurement. The results are shown in Table 2. The calculated dissolution rate was about 0.21 microns/second.

TABLE 2

| Wafer # | Time of development (s) | Thickness loss (μm) |
|---|---|---|
| 1 | 15 | 2.42 |
| 2 | 25 | 4.63 |
| 3 | 35 | 6.75 |
| 4 | 65 | 13.11 |

The photosensitive composition FE-1 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×75 seconds of development), followed by rinsing the developed film with PGMEA for 15 seconds to form a pattern. A resolution of 7 microns at a photospeed of 150 mJ/cm$^2$ was achieved.

Formulation Example 2 (FE-2)

A photosensitive composition was prepared by using 26.72 g of polymer solution (P-1), 4.81 g GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation), 0.02 g para-benzoquinone, and 3.60 g of 1,6-hexanediol diacrylate. After being stirred mechanically for 24 hours, the solution was filtered by using a 5 micron syringe filter.

Process Example 2

The dissolution rate of photosensitive composition FE-2 measured according to the General Procedure for Dissolution Rate Measurement was 0.59 microns/second.

The photosensitive composition FE-2 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×75 seconds of development), followed by rinsing the developed film with PGMEA for 15 seconds to form a pattern. A resolution of 10 microns at a photospeed of 150 mJ/cm$^2$ was achieved.

Comparative Formulation Example 1 (CFE-1)

Effect of Dissolution Rate of the Film as a Function of Amount of SSC

A photosensitive composition was prepared by using 26.72 g of polymer solution (P-1), 4.81 g GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation), 0.02 g para-benzoquinone, and 1.20 g of 1,6-hexanediol diacrylate. After being stirred mechanically for 24 hours, the solution was filtered by using a 5 micron syringe filter.

Comparative Process Example 1

The dissolution rate of photosensitive composition CFE-1 measured according to the general procedure of dissolution rate measurement was 0.05 microns/second.

The photosensitive composition CFE-1 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as developer (2×75 seconds of development) followed by rinsing the developed film with PGMEA for 15 seconds. Severe cracking for all doses and features were observed.

Comparison of Formulation Example 2 (FE-2) and Comparative Formulation Example 1 (CFE-1) shows that the amount of solubility switching compound (SSC) plays an important role in the solubility of the unexposed film and therefore, the lithographic performance of the composition. Here, it is believed that lower dissolution rate of CFE-1 in comparison with FE-2 is due to the lower amount of SSC. In addition, the composition with a lower amount of SSC (CFE-1) showed severe cracking at all doses while the composition with a higher amount of SSC (FE-2) did not show any cracking at all.

Formulation Example 3 (FE-3)

A photosensitive composition was prepared by using 26.72 g of polymer solution (P-1), 4.81 g GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation), 0.02 g para-benzoquinone, and 3.70 g of bisphenol A ethoxylate diacrylate and 0.9 g of pentaerythritol triacrylate. After being stirred mechanically for 24 hours, the solution was filtered by using a 5 micron syringe filter.

Process Example 3

The dissolution rate of photosensitive composition FE-3 measured according to the general procedure of dissolution rate measurement was 0.88 microns/second.

The photosensitive composition FE-3 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×75 seconds of development), followed by rinsing the developed film with PGMEA for 15 seconds to form a pattern. A resolution of 12 microns at a photospeed of 150 mJ/cm$^2$ was achieved.

Comparative Formulation Example 2 (CFE-2)

Effect of Dissolution Rate of the Film as a Function of Amount of Solubility Switching Compound (SSC)

A photosensitive composition was prepared by using 26.72 g of polymer solution (P-1), 3.22 g GBL, 0.48 g of a 0.5 wt % solution of PolyFox 6320 (available from OMNO-VASolutions) in GBL, 0.24 g of gamma-glycidoxypropylt-rimethoxysilane, 0.24 g of NCI-831 (trade name, available from ADEKA corporation), 0.02 g para-benzoquinone, and 2.80 g of bisphenol A ethoxylate diacrylate. After being stirred mechanically for 24 hours, the solution was filtered by using a 5 micron syringe filter.

Comparative Process Example 2

The dissolution rate of photosensitive composition CFE-2 measured according to the general procedure of dissolution rate measurement was 0.09 microns/second.

The photosensitive composition CFE-2 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×75 seconds of development), followed by rinsing the developed film with PGMEA for 15 seconds. Severe cracking and lifting for all doses and features were observed.

Comparative Formulation Example 3 (CFE-3)

Effect of Dissolution Rate of the Film as a Function of Amount of Solubility Switching Compound (SSC)

A photosensitive composition was prepared by using 26.72 g of polymer solution (P-1), 1.64 g of GBL, 0.48 g of a 0.5 wt % solution of PolyFox 6320 (available from OMNOVASolutions) in GBL, 0.24 g of gamma-glycidoxy-propyltrimethoxysilane, 0.24 g of NCI-831 (trade name, available from ADEKA corporation), 0.02 g para-benzoqui-none, and 2.00 g of bisphenol A ethoxylate diacrylate. After being stirred mechanically for 24 hours, the solution was filtered by using a 5 micron syringe filter.

Comparative Process Example 3

The dissolution rate of photosensitive composition CFE-3 measured according to the general procedure of dissolution rate measurement was 0.11 microns/second.

The photosensitive composition CFE-3 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×75 seconds of development), followed by rinsing the developed film with PGMEA for 15 seconds. Severe cracking and lifting for all doses and features were observed.

Comparative Synthesis Example 1 (CP-1)

Synthesis Example 1 was repeated except that the molar ratio of the two monomers was 1:1 and the polymer was isolated by precipitation into water. The amount of water was 10 times the volume of the reaction mixture. The polymer was further purified by re-slurrying with a mixture of 1:1 water/methanol. The weight average molecular weight (Mw) of the resulting polymer was 88,000 Daltons.

Comparative Formulation Example 4 (CFE-4)

Effect of Molecular Weight (Mw)

A photosensitive composition was prepared by using 8.00 g of polymer ((CP-1, Mw=88,000 Daltons), 21.95 g of GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation), 2.70 g of tet-raethylene glycol diacrylate and 0.9 g pentaerythritol tria-crylate. After being stirred mechanically for 24 hours, the solution was filtered by using a 5 micron syringe filter.

Comparative Process Example 4

The photosensitive composition CFE-4 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer. Even after a long development time (3×75 seconds), complete development was not achieved while cracking and lifting was observed. Comparison of lithographic performance of compositions FE-1 and CFE-4 demonstrated that high weight average molecular weights of polyimide polymers (e.g., whose Mw is higher than 70,000 Daltons) have detrimental effect on performance of compositions of this disclosure.

Comparative Formulation Example 5 (CFE-5)

Effect of High Molecular Weight (Mw)

A photosensitive composition was prepared by using 8.00 g of polymer ((CP-1), Mw=88,000 Daltons), 21.95 g of GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation) and 2.80 g of tetraethylene glycol diacrylate. After being stirred mechanically for 24 hours, the solution was filtered by using a 5 micron syringe filter.

Comparative Process Example 5

The photosensitive composition CFE-5 was spin coated on a silicon wafer to form a coating with a thickness of about 15 microns. The coated wafer was baked at 95° C. for 180 seconds. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer. Even after a long development time (3×75 seconds), complete development was not achieved while cracking and lifting was observed.

Formulation Example 4 (FE-4)

A photosensitive composition was prepared by using 26.72 g of polymer solution (P-1), 4.81 g of GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation), 0.02 g para-benzoquinone, and 2.80 g of tetraethylene glycol diacrylate. After being stirred mechanically for 24 hours, the solution was filtered by using a 5 micron syringe filter.

Process Example 4

The photosensitive composition FE-4 was spin coated on a silicon wafer and baked at 95° C. for 180 seconds using a hot plate to form a coating with a thickness of about 15 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×60 seconds of development), followed by rinsing the developed film with PGMEA for 15 seconds to form a pattern. A resolution of 7 microns at a photospeed of 100 mJ/cm$^2$ was achieved.

Comparison of compositions FE-4 versus CFE-5 showed that a composition containing a high Mw polyimide polymer (CFE-5, Mw of 88,000 Daltons) had a low unexposed dissolution rate, and even after 3×75 seconds puddle development could not be fully developed, while a similar composition containing a polyimide polymer with a molecular weight of 51,000 Daltons (FE-4) was developed in a reasonable time with excellent photospeed (100 mJ/cm$^2$) and good resolution (7 microns).

Elongation-to-break, also known as fracture strain, is the ratio between changed length and initial length after breakage of the test specimen by slowly stretching it. It reflects the capability of a material to resist changes of shape without crack formation.

Elongation-to-break of an exposed film of FE-4 was measured at 82% which is indicative of excellent mechanical properties. In order to measure elongation to break, photosensitive composition FE-4 was spin coated on a thin silicon oxide coated wafer and baked at 95° C. for 180 seconds using a hot plate to form a coating with a thickness of about 15 microns. The wafer was then exposed with a dog-bone mask in broadband UV exposure tool (Carl Süss MA-56) and then baked at about 200° C. for one hour in YES oven under vacuum. The baked, exposed film was then released from the wafer by placing the wafer in 2% HF for 1 hour. The film was then rinsed with DI-water and dried by using air. Then, the elongation to break of 15 mm×5 mm dog-bone structured film was measured by an Instron 5543. A total of 10 measurements were performed. The lowest and highest numbers were eliminated and average of the other 8 measurements was calculated.

Comparative Synthesis Example 2 (CP-2)

Synthesis Example 2 was repeated except that the ratio of two monomers 6FDA to DAPI was 11/12 and polymer was isolated by precipitation into water. The weight average molecular weight (Mw) of the resulting polymer was 13,500 Daltons.

Comparative Formulation Example 6 (CFE-6)

Effect of Low Molecular Weight (Mw)

A photosensitive composition was prepared by using 8.00 g of polymer ((P-2, Mw=13,500 Daltons), 21.95 g of GBL, 0.48 g of a 0.5 wt % solution of PolyFox 6320 (available from OMNOVASolutions) in GBL, 0.24 g of gamma-glycidoxypropyltrimethoxysilane, 0.24 g of NCI-831 (trade name, available from ADEKA corporation) and 2.80 g of tetraethylene glycol diacrylate. After being stirred mechanically for 24 hours, the solution was filtered by using a 5 micron syringe filter.

Comparative Process Example 6

The photosensitive composition CFE-6 was spin coated on a silicon wafer to form a coating with a thickness of about 15 microns. The coated wafer was baked at 95° C. for 180 seconds. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×35 seconds of development), followed by rinsing the developed film with PGMEA for 15 seconds. Severe cracking was observed on exposed areas which is believed to be indicative of weak mechanical properties of the film. Comparative Formulation Example 6 has the identical composition to Formulation Example 4 except with a different molecular weight for the polymer. The results of the lithographic experiments for both compositions showed that a polyimide polymer having a lower weight average molecule weight could result in poor mechanical properties.

Formulation Example 5 (FE-5)

A photosensitive composition was prepared by using 38.71 g of polymer solution (P-1), 8.6 g of GBL, 0.75 g of a 0.5 wt % solution of PolyFox 6320 (available from OMNOVASolutions) in GBL, 0.63 g of methacryloxypropyltrimethoxysilane, 0.38 g of NCI-831 (trade name, available from ADEKA corporation), 0.03 g para-benzoquinone, 4.22 g of tetraethylene glycol diacrylate and 1.41 g of pentaerythritol triacrylate. After being stirred mechanically for 24 hours, the solution was filtered by using a 5 micron syringe filter.

Process Example 5

The dissolution rate of photosensitive composition FE-5 measured according to the general procedure of dissolution rate measurement was 0.37 microns/second.

The photosensitive composition FE-5 was spin coated on a silicon wafer and baked at 95° C. for 180 seconds using a hot plate to form a coating with a thickness of about 5 microns. The photosensitive polyimide film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×60 seconds of development), followed by rinsing the developed film with PGMEA for 15 seconds to form a pattern. A resolution of 2 microns at a photospeed of 100 mJ/cm² was achieved. The film thickness loss was 17.2%.

Dry Film Example DF-1

Preparation of composition FE-5 was repeated in a 5 time larger scale and the formulation was filtered by using a 0.2 μm filter (Ultradyne from Meissner Filtration Product, Inc., cat. no. CFTM10.2-44B1). The filtered photosensitive solution was applied using reverse microbar coater from Fujifilm USA (Greenwood, S.C.) with line speed of 2 feet/minutes (60 cm per minutes) with 30 um microbar clearance onto a polyethylene terephthalate (PET) film (TA 30, manufactured by Toray Plastics America, Inc.) having a width of 16.2" and thickness of 35 μm used as a carrier substrate and dried at 210° F. to obtain a photosensitive polymeric layer with a thickness of approximately 5.0 microns. On this polymeric layer, a biaxially oriented polypropylene film having width of 18" and thickness of 20 μm (BOPP, manufactured by Mirwec Film Inc, Bloomington, Ind., trade name BOPLON) was laid over by a roll compression to act as a protective layer.

Dry Film Example DF-2

Preparation of composition FE-5 was repeated in a 5 time larger scale and the formulation was filtered by using a 0.2 μm filter (Ultradyne from Meissner Filtration Product, Inc., cat. no. CFTM10.2-44B1). The filtered photosensitive solution was applied using reverse microbar coater from Fujifilm USA (Greenwood, S.C.) with line speed of 2 feet/minutes (60 cm per minutes) with 60 um microbar clearance onto a polyethylene terephthalate (PET) film (TA 30, manufactured by Toray Plastics America, Inc.) having a width of 16.2" and thickness of 35 μm used as a carrier substrate and dried at 210° F. to obtain a photosensitive polymeric layer with a thickness of approximately 10.0 microns. On this polymeric layer, a biaxially oriented polypropylene film having width of 18" and thickness of 20 μm (BOPP, manufactured by Mirwec Film Inc, Bloomington, Ind., trade name BOPLON) was laid over by a roll compression to act as a protective layer.

Lamination of Dry Film (Example L1)

After the removal of the protective layer by peeling, the photosensitive polymeric layer of dry film structure DF-1 (6"×6") was placed on 4" Wafernet copper coated wafer. The polymeric layer was laminated onto the Cu coated wafer by vacuum lamination (0.2-0.4 Torr) for 20 seconds followed by being subjected to both a pressure of 40 psi and vacuum of 0.2-0.4 Torr for 70 seconds. The lamination temperature was 90° C. Lamination process was done by using a DPL-24A Differential Pressure Laminator manufactured by OPTEK, NJ.

Lithographic Evaluation of Laminated DF-1

The carrier substrate of the copper wafer laminated by composition DF-1 in Example L1 was removed. The photosensitive polymeric layer was then exposed to actinic light utilizing an i-line stepper in a patterned exposure array, which incrementally increased exposure energy by 50 mJ/cm² with a starting exposure energy of 50 mJ/cm². The exposed film was then heated at 50° C. for 3 minutes, and developed using two 75-second puddles using cyclopentanone. The film was then washed with PGMEA for 15 seconds. A relief pattern with a resolution of 2 microns was obtained at energy dose of 100 mJ/cm². The film thickness loss was 26.7%.

While the subject matter of this disclosure has been described in detail with reference to certain embodiments thereof, it will be understood that modifications and variations are within the spirit and scope of that which is described and claimed.

What is claimed is:
1. A photosensitive composition, comprising:
at least one fully imidized polyimide polymer having a weight average molecular weight in the range of about 20,000 Daltons to about 70,000 Daltons, wherein the at least one fully imidized polyimide polymer is prepared from at least one diamine, and the at least one diamine comprises a compound selected from the group consisting of a diamine of Structure (Ia) and a diamine of Structure (Ib),

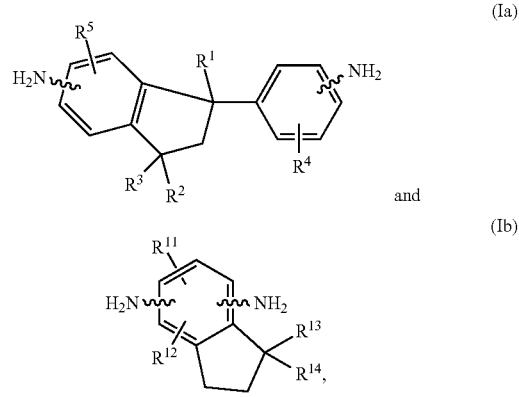

in which each of $R^1$, $R^2$, $R^3$, $R^4$, $R^5$, $R^{11}$, $R^{12}$, $R^{13}$ and $R^{14}$, independently, is H, a substituted or unsubstituted $C_1$-$C_6$ linear or branched alkyl group, or a $C_5$-$C_7$ cycloalkyl group;
at least one solubility switching compound;
at least one photoinitiator; and
at least one solvent;
wherein the composition is capable of forming a film having a dissolution rate of greater than about 0.15 micron/second using cyclopentanone as a developer.
2. The photosensitive composition of claim 1, wherein the at least one diamine is selected from the group consisting of 1-(4-aminophenyl)-1,3,3-trimethylindan-5-amine, 1-(4-aminophenyl)-1,3,3-trimethyl-2H-inden-5-amine, 1-(4-aminophenyl)-1,3,3-trimethyl-indan-5-amine, [1-(4-aminophenyl)-1,3,3-trimethyl-indan-5-yl]amine, and 1-(4-aminophenyl)-2,3-dihydro-1,3,3-trimethyl-1H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1- dimethylindan, 4,7-diamino-1,1-dimethylindan, 5,7-diamino-1,1,4-trimethylindan, 5,7-diamino-1,1,6-trimethylindan, and 5,7-diamino-1,1-dimethyl-4-ethylindan.

3. The photosensitive composition of claim 1, wherein the at least one fully imidized polyimide polymer is prepared from at least one dianhydride, the at least one dianhydride comprising a compound selected from the group consisting of 2,2-[bis(3,4-dicarboxyphenyl)]hexafluoropropane dianhydride, 3,3',4,4'-benzophenone tetracarboxylic dianhydride, 3,3',4,4'-diphenylsulfone tetracarboxylic dianhydride, and 3,3',4,4'-diphenyl ether tetracarboxylic dianhydride.

4. The photosensitive composition of claim 3, wherein the at least one fully imidized polyimide polymer is prepared from a fluorinated dianhydride.

5. The photosensitive composition of claim 4, wherein the fluorinated dianhydride is selected from a group consisting of:

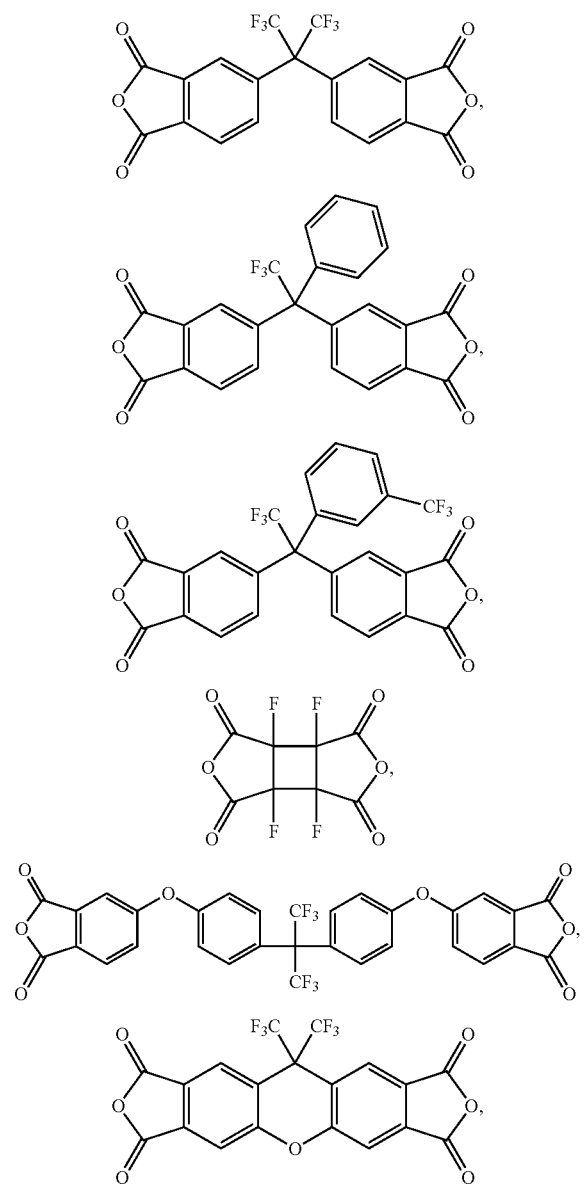

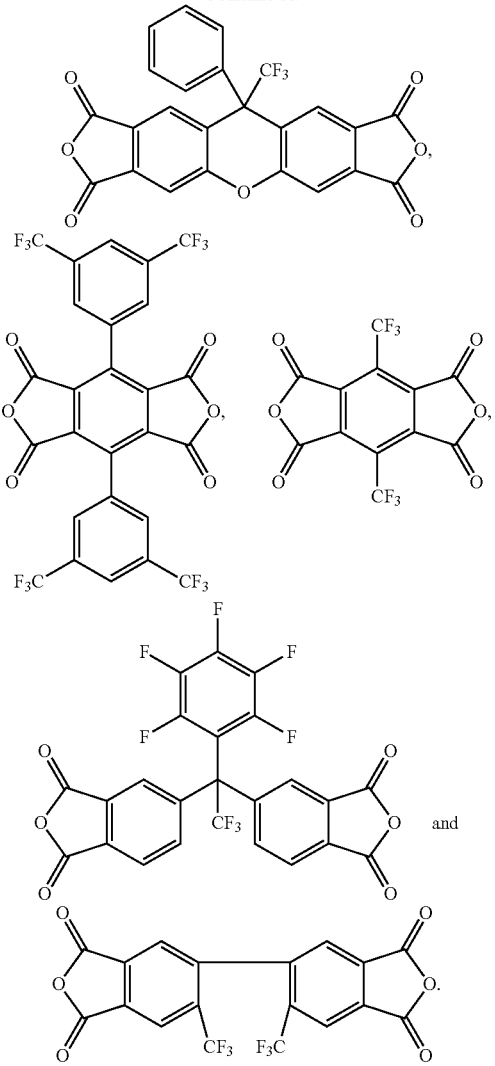

6. The photosensitive composition of claim 1, wherein the at least one fully imidized polyimide polymer is prepared from at least one diamine selected from the group consisting of a diamine of Structure (Ia) and a diamine of Structure (Ib), and 2,2-[bis(3, 4-dicarboxyphenyl)] hexafluoropropane dianhydride.

7. The photosensitive composition of claim 1, wherein the solubility switching compound comprises at least one functional group selected from the group consisting of a vinyl group, an allyl group, a vinyl ether group, a propenyl ether group, a (meth)acryloyl group, an a SiH group, and a thiol group.

8. The photosensitive composition of claim 7, wherein the solubility switching compounds is selected from the group consisting of 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

9. The photosensitive composition of claim 1, wherein the developer and the at least one fully imidized polyimide polymer has a relative energy difference of from about 0.1 to about 3.

10. The photosensitive composition of claim 1, wherein when an area of the film made from the composition is exposed to actinic radiation, the exposed area has a dissolution rate of less than about 0.02 microns/second in cyclopentanone.

11. The photosensitive composition of claim 1, wherein the solubility switching compound increases a dissolution rate of the film in cyclopentanone compared to a film made from a photosensitive composition containing the same components without the solubility switching compound.

12. A photosensitive film formed from the photosensitive composition of claim 1.

13. A process, comprising:
coating a substrate with the composition of claim 1 to form a coated substrate having a film on the substrate, and
baking the coated substrate to form a coated substrate having a dried film.

14. The process of claim 13, wherein the coated substrate is baked at a temperature from about 50° C. to about 200° C.

15. The process of claim 14, further comprising exposing the dried film to radiation through a mask to form a coated substrate having a dried, patternwise exposed film.

16. The process of claim 15, further comprising baking the dried, patternwise exposed film at a temperature from about 50° C. to about 150° C. in a second baking step.

17. The process of claim 16, further comprising developing a portion of the dried, exposed film in a developer to produce a relief image on the substrate.

18. The process of claim 17, further comprising rinsing the relief image on the substrate with a solvent or a mixture of solvents.

19. The process of claim 18, further comprising baking the substrate having a relief image at a temperature from about 50° C. to about 200° C. in a third baking step.

20. A three dimensional object, comprising at least one patterned film formed by the process of claim 13.

21. The three dimensional object of claim 20, comprising patterned films in at least two stacks.

22. The three dimensional object of claim 20, comprising patterned films in at least three stacks.

23. A semiconductor device, comprising the three dimensional object of claim 20.

24. The semiconductor device of claim 23, wherein the semiconductor device is an integrated circuit, a light emitting diode, a solar cell, or a transistor.

25. A dry film structure, comprising a carrier substrate, and a first polymeric layer supported by the carrier substrate, wherein the first polymeric layer is prepared from the photosensitive composition of claim 1.

26. The dry film structure of claim 25, further comprising a protective layer, wherein the first polymeric layer is between the carrier substrate and the protective layer.

27. The dry film structure of claim 25, wherein the first polymeric layer has a film thickness of at most 5 microns.

28. The dry film structure of claim 26, further comprising a second polymeric layer, wherein the second polymeric layer is between the first polymeric layer and the carrier substrate or the second polymeric layer is between the first polymeric layer and the protective layer.

29. The dry film structure of claim 28, wherein the second polymeric layer comprises a water soluble polymer.

30. A process, comprising:
applying the dry film structure of claim 25 onto an electronic substrate to form a laminate.

31. The process of claim 30, further comprising exposing the polymeric layer in the laminate to actinic radiation.

32. The process of claim 31, further comprising removing the carrier substrate before or after exposing the polymeric layer.

33. The process of claim 32, further comprising removing unexposed portions in the polymeric layer by using a developer.

34. The process of claim 33, further comprising baking the remaining exposed portion of polymeric layer.

35. A three dimensional object formed by the process of claim 30.

36. A semiconductor device, comprising the three dimensional object of claim 35.

37. The semiconductor device of claim 36, wherein the semiconductor device is an integrated circuit, a light emitting diode, a solar cell, or a transistor.

38. A process, comprising:
(a) providing a dry film structure comprising:
a carrier substrate;
optionally, a protective layer; and
a photosensitive polymeric layer between the carrier substrate and the optional protective layer, the photosensitive polymeric layer comprising at least one fully imidized polyimide polymer having a weight average molecular weight in the range of about 20,000 Daltons to about 70,000 Daltons; at least one solubility switching compound; and at least one photoinitiator; wherein the at least one fully imidized polyimide polymer is prepared from at least one diamine, and the at least one diamine comprises a compound selected from the group consisting of a diamine of Structure (Ia) and a diamine of Structure (Ib),

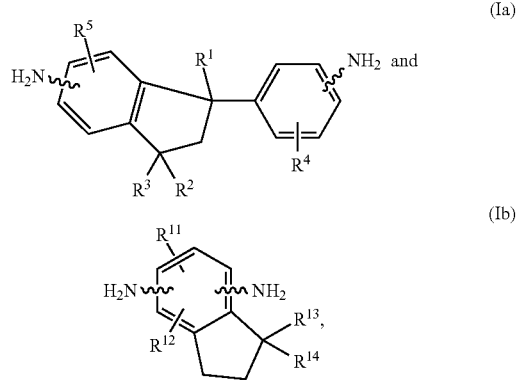

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or a $C_5$-$C_7$ cycloalkyl group;
(b) optionally, removing the protective layer, if present, from the dry film structure;
(c) applying the structure obtained in step (b) onto an electronic substrate to form a laminate, the laminate comprising the photosensitive polymeric layer between the electronic substrate and the carrier substrate; and (d) converting the photosensitive polymeric layer into a patterned layer;
wherein the patterned layer has a thickness of at most about 5 microns and comprises at least one element having a feature size of at most about 3 microns.

39. The process of claim 38, wherein the patterned layer has a thickness of at most about 4 microns.

40. The process of claim 39, wherein the patterned layer has a thickness of at most about 3 microns.

41. The process of claim 38, wherein the patterned layer comprises at least one element having a feature size of at most about 2 microns.

42. A photosensitive composition, comprising:
at least one polyimide polymer having a weight average molecular weight in the range of about 20,000 Daltons to about 70,000 Daltons, wherein the at least one polyimide polymer is prepared from at least one diamine, and the at least one diamine comprises a compound selected from the group consisting of a diamine of Structure (Ia) and a diamine of Structure (Ib),

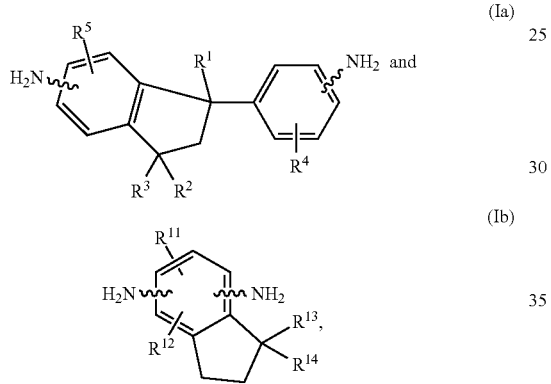

in which each of $R^1$, $R^2$, $R^3$, $R^4$, $R^5$, $R^{11}$, $R^{12}$, $R^{13}$, and $R^4$, independently, is H, a substituted or unsubstituted $C_1$-$C_6$ linear or branched alkyl group, or a $C_5$-$C_7$ cycloalkyl group;
at least one solubility switching compound;
at least one photoinitiator; and
at least one solvent;
wherein the composition is capable of forming a film having a dissolution rate of greater than about 0.15 micron/second using cyclopentanone as a developer, and the solubility switching compound increases a dissolution rate of the film in cyclopentanone compared to a film made from a photosensitive composition containing the same components without the solubility switching compound.

43. The photosensitive composition of claim 1, wherein the at least one fully imidized polyimide polymer comprises an end-capping group at a terminus, the end-capping group being formed by using an end-capping compound having a first functional group reactive to the terminal $NH_2$ groups or anhydride group and a second functional group selected from the group consisting of a substituted or unsubstituted alkenyl group, a substituted or unsubstituted alkynyl group, a masked maleimide group, and an unsubstituted alkyl group.

44. The process of claim 33, wherein the developer and the fully imidized polyimide polymer have a relative energy difference from about 0.1 to about 3.

45. A process, comprising:
(a) providing a dry film structure comprising:
a carrier substrate;
optionally, a protective layer; and
a photosensitive polymeric layer between the carrier substrate and the optional protective layer, the photosensitive polymeric layer comprising at least one fully imidized polyimide polymer having a weight average molecular weight in the range of about 20,000 Daltons to about 70,000 Daltons, in which the dissolution rate of the polymeric layer in cyclopentanone is greater than about 0.15 microns/second; at least one solubility switching compound; and at least one photoinitiator; wherein the at least one fully imidized polyimide polymer is prepared from at least one diamine, and the at least one diamine comprises a compound selected from the group consisting of a diamine of Structure (Ia) and a diamine of Structure (Ib),

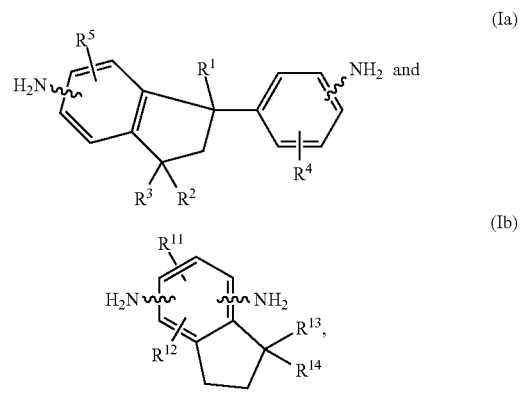

in which each of $R^1$, $R^2$, $R^3$, $R^4$, $R^5$, $R^{11}$, $R^{12}$, $R^{13}$, and $R^{14}$, independently, is H, a substituted or unsubstituted $C_1$-$C_6$ linear or branched alkyl group, or a $C_5$-$C_7$ cycloalkyl group;
(b) optionally, removing the protective layer, if present, from the dry film structure; and
(c) applying the structure obtained in step (b) onto an electronic substrate to form a laminate, the laminate comprising the photosensitive polymeric layer between the electronic substrate and the carrier substrate.

* * * * *

UNITED STATES PATENT AND TRADEMARK OFFICE
CERTIFICATE OF CORRECTION

PATENT NO. : 10,036,952 B2  
APPLICATION NO. : 15/132486  
DATED : July 31, 2018  
INVENTOR(S) : Sanjay Malik et al.

Page 1 of 1

It is certified that error appears in the above-identified patent and that said Letters Patent is hereby corrected as shown below:

In the Claims

Column 44  
Line 49, in Claim 1, delete "$R^{13}$" and insert -- $R^{13}$, -- therefor.

Column 46  
Line 54, in Claim 7, after "group" delete "an".

Column 49  
Line 40, in Claim 42, delete "$R^4$," and insert -- $R^{14}$, -- therefor.

Signed and Sealed this  
Second Day of October, 2018

Andrei Iancu  
*Director of the United States Patent and Trademark Office*